US012727299B2

(12) United States Patent
Oshio et al.

(10) Patent No.: US 12,727,299 B2
(45) Date of Patent: Sep. 1, 2026

(54) LIGHT-EMITTING DEVICE AND ELECTRONIC APPARATUS USING SAME

(71) Applicant: Panasonic Intellectual Property Management Co., Ltd., Osaka (JP)

(72) Inventors: Shozo Oshio, Osaka (JP); Mitsuru Nitta, Kyoto (JP); Ryosuke Shigitani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 425 days.

(21) Appl. No.: 18/276,022

(22) PCT Filed: Feb. 10, 2022

(86) PCT No.: PCT/JP2022/005458
§ 371 (c)(1),
(2) Date: Aug. 5, 2023

(87) PCT Pub. No.: WO2022/176782
PCT Pub. Date: Aug. 25, 2022

(65) Prior Publication Data

US 2024/0304764 A1 Sep. 12, 2024

(30) Foreign Application Priority Data

Feb. 22, 2021 (JP) ................................ 2021-026804

(51) Int. Cl.
*H10H 20/851* (2025.01)
*C09K 11/77* (2006.01)

(52) U.S. Cl.
CPC ... *H10H 20/8513* (2025.01); *C09K 11/77348* (2021.01); *C09K 11/7774* (2013.01); *C09K 11/7776* (2013.01)

(58) Field of Classification Search
CPC .......... H10H 20/8513; C09K 11/77348; C09K 11/7774; C09K 11/7776; C09K 11/77742
See application file for complete search history.

(56) References Cited

U.S. PATENT DOCUMENTS

2015/0078010 A1* 3/2015 Kundaliya ................ F21V 9/38 204/489
2020/0048549 A1 2/2020 Hong
(Continued)

FOREIGN PATENT DOCUMENTS

CN 111442198 A 7/2020
JP 2019-204831 A 11/2019
(Continued)

OTHER PUBLICATIONS

Extended European Search Report for corresponding EP Application No. 22756102.4 issued Jun. 24, 2024.
(Continued)

*Primary Examiner* — Fernando L Toledo
*Assistant Examiner* — Jorge Andres Lopez
(74) *Attorney, Agent, or Firm* — Renner, Otto, Boisselle & Sklar, LLP

(57) ABSTRACT

Disclosed is a light-emitting device provided with a solid-state light-emitting element and a phosphor and emits output light. The spectral distribution of the output light has a first light component and a second light component derived from fluorescence emitted by the phosphor, and has a first minimum value between the first light component and the second light component. The first light component is a fluorescent component having a maximum intensity value within a wavelength range of 560 nm or more and less than 700 nm. The second light component is a fluorescent component having a maximum intensity value within a wavelength range of 700 nm or more and less than 2500 nm. The maximum intensity value of the second light component is
(Continued)

greater than that of the first light component. The first minimum value is less than 50% of the maximum intensity value of the second light component.

12 Claims, 5 Drawing Sheets

(56) References Cited

U.S. PATENT DOCUMENTS

| | | | | |
|---|---|---|---|---|
| 2020/0109331 | A1 | 4/2020 | Oshio et al. | |
| 2021/0193884 | A1 * | 6/2021 | Nakamura ......... | H10H 20/8513 |
| 2022/0175250 | A1 | 6/2022 | Abe et al. | |
| 2022/0177779 | A1 | 6/2022 | Hong | |

FOREIGN PATENT DOCUMENTS

| | | | |
|---|---|---|---|
| KR | 102193591 | A1 | 12/2020 |
| WO | 2018/207703 | A1 | 11/2018 |
| WO | 2018/230207 | A1 | 12/2018 |
| WO | 2020/217671 | A1 | 10/2020 |

OTHER PUBLICATIONS

International Search Report for corresponding Application No. PCT/JP2022/005458, mailed Mar. 22, 2022.

Written Opinion for corresponding Application No. PCT/JP2022/005458, mailed Mar. 22, 2022.

* cited by examiner

SPECTRAL INTENSITY (a.u.)
0.000
0.005
0.010
0.015
0.020
0.025
0.030
WAVELENGTH (nm)
350
400
450
500
550
600
650
700
750
800
850
900
950
1000
1050
5
6
7
8
9

LIGHT-EMITTING DEVICE AND ELECTRONIC APPARATUS USING SAME

TECHNICAL FIELD

The present invention relates to a light-emitting device and an electronic apparatus using the same.

BACKGROUND ART

There is a prior known light-emitting device that is obtained by combining a solid-state light-emitting element and a phosphor and that emits output light containing a near-infrared light component (see Patent Literature 1).

Patent Literature 1 discloses a light-emitting element for industrial equipment used as an alternative to halogen lamps and the like. Specifically, the light-emitting element is provided with: an LED element that emits excitation light having a single peak wavelength at 380 to 500 nm; a phosphor onto which the excitation light is incident, and which emits fluorescence of a longer wavelength than the excitation light; and a light extraction surface which outputs outgoing light formed by superposing the excitation light and the fluorescence. Also, the outgoing light exhibits light emission over a range of at least the peak wavelength of the excitation light or more and 1050 nm or less, and, in a range from at least the peak wavelength of the excitation light to 1050 nm, all of the outgoing light exhibits a light emission intensity that is equal to or greater than the light emission intensity at 1050 nm.

CITATION LIST

Patent Literature

Patent Literature 1: Japanese Unexamined Patent Application Publication No. 2019-204831

SUMMARY OF INVENTION

However, development of the prior light-emitting device, which is obtained by combining a solid-state light-emitting element and a phosphor and which emits near-infrared and visible light components at the same time, is progressing for the purpose of replacing halogen lamp devices. Therefore, the spectral distribution of the output light is wide, and for example, the light energy of the output light is dispersed over a wide range from a wavelength of around 420 nm to around 1000 nm.

Here, the wavelength components required for inspection and so forth are different according to the inspection subject and purpose, and the minimum required wavelength is limited. Nevertheless, since the output light of the prior light-emitting device has a spectral distribution having wide band properties, there are many unnecessary wavelength components, and there has been a problem that the light components of the output light are not utilized effectively. Furthermore, the light intensity of the required wavelength of the output light is small, and therefore it has been difficult to reduce the size and increase the output and efficiency of the light-emitting device.

The present invention has been made in consideration of such problems as described above, which are inherent in the prior art. An object of the present invention is to provide a light-emitting device that is advantageous for increasing the output of visible light components and near-infrared light components of a specific wavelength, and to provide an electronic apparatus that uses the light-emitting device.

To solve the above problems, a light-emitting device according to a first aspect of the present invention is a light-emitting device that is provided with a solid-state light-emitting element and a phosphor and emits output light. The spectral distribution of the output light has a first light component and a second light component derived from fluorescence emitted by the phosphor, and has a first minimum value between the first light component and the second light component. The first light component is a fluorescent component having a maximum intensity value within a wavelength range of 560 nm or more and less than 700 nm. The second light component is a fluorescent component having a maximum intensity value within a wavelength range of 700 nm or more and less than 2500 nm. The maximum intensity value of the second light component is greater than the maximum intensity value of the first light component. The first minimum value is less than 50% of the maximum intensity value of the second light component.

An electronic apparatus according to a second aspect of the present invention is provided with the aforementioned light-emitting device.

DESCRIPTION OF EMBODIMENTS

Figure 1:
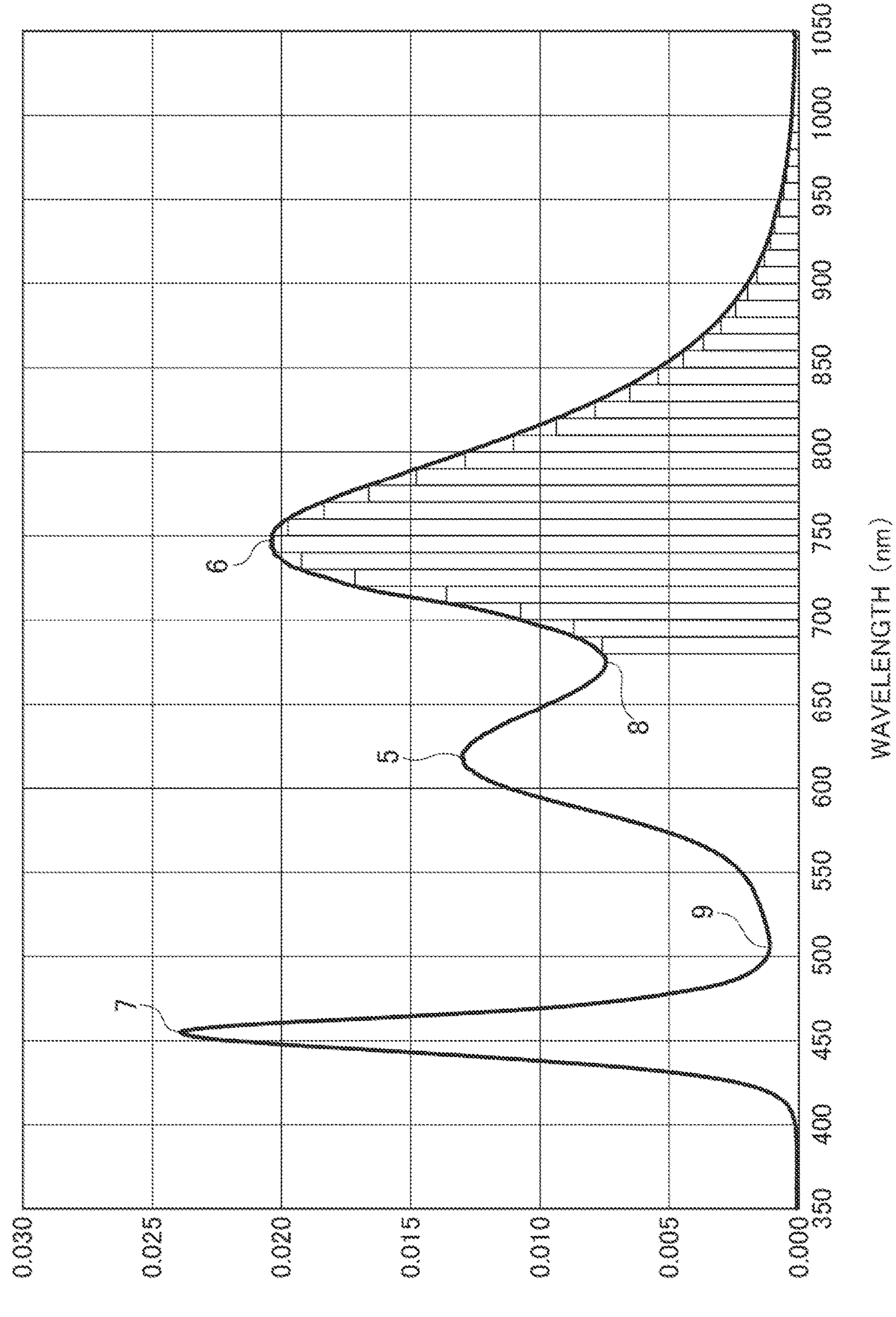
FIG. 1 is a graph illustrating an example of the spectral distribution of output light emitted by a light-emitting device of an embodiment herein.

A light-emitting device according to an embodiment herein and an electronic apparatus using the light-emitting device will be described in detail below with reference to the drawings. Note that dimensional ratios in the drawings are exaggerated for convenience of the description and may be different from actual ratios.

[Light-Emitting Device]

The light-emitting device of the present embodiment is a light-emitting device that is obtained by at least combining a solid-state light-emitting element 3 and a phosphor (first phosphor 1, second phosphor 2), and that emits output light 4. Also, the output light 4 emitted by the light-emitting device has a spectral distribution such as that illustrated in FIG. 1.

(Output Light of Light-Emitting Device)

The spectral distribution of the output light 4 emitted by the light-emitting device of the present embodiment has, as illustrated in FIG. 1, at least a first light component 5 and a second light component 6 derived from fluorescence of the phosphor. In addition, the spectral distribution of the output light 4 has a first minimum value 8, namely a valley, between the first light component 5 and the second light component 6. As is clear from FIG. 1, the first light component 5 and the second light component 6 are light components having different color tones from each other.

Also, the first light component 5 is a fluorescent component (visible light component) having a maximum intensity value in a range of wavelengths of 380 nm or more and less than 700 nm, preferably wavelengths of 450 nm or more and less than 700 nm, and more preferably wavelengths of 500 nm or more and less than 660 nm. Furthermore, the second light component 6 is a fluorescent component (near-infrared light component) having a maximum intensity value in a range of wavelengths of 700 nm or more and less than 2500 nm, and preferably wavelengths of 750 nm or more and less than 1800 nm.

In addition, the wavelength at which the first light component exhibits the maximum intensity value is preferably 560 nm or more, more preferably 575 nm or more, and even more preferably 590 nm or more. Furthermore, the maximum intensity value of the second light component 6 is preferably larger than the maximum intensity value of the first light component 5. In addition, the first minimum value 8 is preferably less than 50%, and more preferably less than 30%, of the maximum intensity value of the second light component 6.

Note that the longest wavelength of the wavelength range of the output light 4, namely the wavelength range related to the second light component 6, can be 800 nm, 900 nm, 1000 nm, 1200 nm, or 1500 nm.

When the output light 4 has a spectral distribution such as this, the visible light component and the near-infrared light component are clearly separated as the first light component 5 and the second light component 6, respectively, and the intensity of the near-infrared light component becomes higher. Therefore, this light-emitting device is convenient for applications where the light component used for a main purpose is near-infrared light, and the light component used for an auxiliary purpose is visible light. In addition, with the light-emitting device, it is easy to implement lighting design with good electro-light conversion efficiency and light utilization efficiency.

Furthermore, since the light-emitting device uses a phosphor, it is comparatively easy to control the spectral distribution. In addition, the light component in at least the near-infrared wavelength range does not have extremely narrow band properties such as those of infrared rays emitted by an infrared LED, nor does it have ultra-wide band properties like those of a conventional LED light source, but rather it has an appropriate bandwidth. Therefore, this light-emitting device is advantageous in obtaining near-infrared light having a bandwidth that is neither excessive nor insufficient, which is necessary for an inspection device.

Here, the photodetection sensitivity of a quantum-type photodetector such as a CMOS sensor decreases with long wavelengths from around 500 nm. Therefore, in inspection devices and monitoring devices obtained by combining a light-emitting device and said photodetector, it becomes possible to align the detection levels for the visible region and the near-infrared region by using the output light 4. That is, the detection levels for the visible region and the near-infrared region are decided by the product of the sensitivity of the photodetector and the output light intensity of the light-emitting device. Therefore, in a wavelength range exceeding 500 nm, it becomes possible for the above detection levels to be aligned by adopting a spectral distribution in which the maximum intensity value of the second light component 6 is larger than the maximum intensity value of the first light component 5.

In the light-emitting device, it is preferable that the spectral distribution of the second light component 6, namely the spectral distribution on the side where the wavelength is longer than the wavelength of the first minimum value 8, be unimodal when the spectral intensities of each wavelength of 10 nm are displayed as a histogram. Here, in the present specification, "unimodal" refers to a distribution state in which there is one peak in a histogram. To facilitate this understanding, data for the related wavelength range is displayed also as a histogram in FIG. 1. By making the second light component 6 unimodal, the near-infrared light component is concentrated in a specific wavelength range, and therefore the light-emitting device is advantageous for increasing the output and efficiency of near-infrared light.

In the second light component 6, the wavelength difference between a wavelength on the long-wavelength side and a wavelength on the low-wavelength side at which an intensity that is 50% of the maximum intensity value is obtained is preferably 50 nm or more and less than 200 nm, and more preferably 50 nm or more and less than 150 nm. By making the second light component 6 have a comparatively narrow bandwidth such as this, the near-infrared light component is concentrated in a specific wavelength range. Therefore, the light-emitting device is advantageous for increasing the output and efficiency of near-infrared light of a specific wavelength.

Meanwhile, the spectral distribution of the first light component 5 is preferably unimodal when the spectral intensities of each wavelength of 10 nm are displayed as a histogram. Furthermore, in the first light component 5, the wavelength difference between a wavelength on the long-wavelength side and a wavelength on the low-wavelength side at which an intensity that is 60% of the maximum intensity value is obtained is preferably 50 nm or more and less than 200 nm, and more preferably 50 nm or more and less than 150 nm. When the first light component 5 is made to have a spectral distribution such as this, the visible light component is concentrated in a specific wavelength range. Therefore, the light-emitting device is advantageous for increasing the output and efficiency of visible light used for an auxiliary purpose.

In particular, it is preferable that both the first light component 5 and the second light component 6 have a unimodal form such as that described above and a form in which the spectral width becomes narrow. As a result, both the visible light component and the near-infrared light component making up the output light 4 are concentrated in a specific wavelength range, and therefore the light-emitting device is even more advantageous for increasing output and efficiency.

In this way, the light-emitting device of the present embodiment can not only see the object to be examined with a composite view of visible light and near-infrared light, but can also radiate, without excess or deficiency, visible light and near-infrared light suitable for the object to be inspected.

Therefore, by using the light-emitting device, it is possible to non-destructively detect foreign substances that are difficult to identify with near-infrared rays alone. Furthermore, the light-emitting device is advantageous for reducing the size, increasing the sensitivity, and increasing the efficiency of a foreign substance inspection device and a light source used therefor, and also facilitates responding to customer requests.

In the light-emitting device of the present embodiment, the spectral distribution of the output light 4 may further have a third light component 7 derived from light (primary light 3B) emitted by the solid-state light-emitting element 3. The third light component 7 can then be a light component within the wavelength range of ultraviolet light or visible light. Specifically, the third light component 7 can be a light component having a maximum intensity value within a wavelength range of 350 nm or more and less than 660 nm. Furthermore, the third light component 7 can be a visible light component having a maximum intensity value within a wavelength range of wavelengths of 405 nm or more and less than 600 nm, preferably 435 nm or more and less than 540 nm, and particularly preferably 435 nm or more and less than 480 nm. In this case, the spectral distribution of the output light 4 comes to have a second minimum value 9 between the first light component 5 and the third light component 7. Therefore, the spectral distribution between the first minimum value 8 and the second minimum value 9 becomes unimodal when the spectral intensity for each 10 nm is displayed as a histogram.

Note that it is particularly preferable that the third light component 7 have a maximum intensity value within a wavelength range of 440 nm or more and less than 470 nm. In this way, commercially available blue light-emitting diodes (blue LEDs), blue laser diodes (blue LDs), and the like can be used as they are, therefore resulting in a light-emitting device that is advantageous for rapid product development and industrial production.

The spectral distribution of the output light 4 preferably has the first minimum value 8 within a wavelength range of 650 nm or more and less than 800 nm, and more preferably has the first minimum value 8 within a wavelength range of 700 nm+50 nm. The first minimum value 8 is preferably less than 50% of the maximum intensity value in the spectral distribution within a wavelength range of 380 nm or more and 2500 nm or less, and more preferably less than 50% of the maximum intensity value in the spectral distribution within a wavelength range of 380 nm or more and 960 nm or less. In this way, there is a reduction in interference between the first light component 5 composed mainly of a visible light component, and the second light component 6 having a near-infrared light component. Therefore, a spectral distribution is obtained in which visible light and near-infrared light are separated to some extent with the wavelength of approximately 700 nm as a boundary. As a result, the light-emitting device is advantageous for improving the S/N ratio (signal/noise ratio) of a detector that detects near-infrared light.

The first minimum value 8 and the second minimum value 9 are preferably less than 50%, and more preferably less than 30%, of the maximum intensity value of the second light component 6. In addition, in the second light component 6, the wavelength difference between a wavelength on the long-wavelength side and a wavelength on the low-wavelength side at which an intensity that is 50% of the maximum intensity value is obtained is preferably 50 nm or more and less than 200 nm, and more preferably 50 nm or more and less than 150 nm. In this way, not only the near-infrared light component but also the visible light component comes to have an appropriate bandwidth. Therefore, the light-emitting device can be used for a foreign substance inspection device, and has good energy efficiency for electro-light conversion.

The first light component 5 preferably has a maximum intensity value in a wavelength range of 570 nm or more and less than 650 nm, and more preferably has a maximum intensity value in a wavelength range of 580 nm or more and less than 620 nm. In this way, in the output light 4, the visible light component becomes a yellow to orange to red light component. Therefore, the light-emitting device is capable of detecting organic foreign substances that easily reflect yellow to orange to red light components, are difficult to detect with near-infrared rays alone and also are brown in color. Note that such organic foreign substances include brown hair, dry leaves, dry grass, and the like.

It is preferable that the first light component 5 be derived from fluorescence emitted by a phosphor activated with $Ce^{3+}$ or $Eu^{2+}$. These kinds of phosphors exhibit short-afterglow optical properties with which fluorescence output saturation is unlikely even under high-density excitation, and therefore the light-emitting device has a high wavelength conversion efficiency and is advantageous for increasing output. Furthermore, commercially available phosphors for LED lighting can be used as they are, and therefore the light-emitting device is also advantageous for rapid product development and industrial production.

It is preferable that the first light component 5 include a fluorescent component having a maximum intensity value within a wavelength range of 570 nm or more and less than 650 nm. In addition, this fluorescent component is preferably derived from the first phosphor 1, which is activated with $Ce^{3+}$ and has a garnet-type crystal structure. Furthermore, the second light component 6 is preferably derived from a fluorescent component of the second phosphor 2, which has an excitation peak within a wavelength range of 450 nm or more and less than 520 nm. In this way, from among the fluorescent components emitted by the first phosphor 1, a blue-green light component located on the short-wavelength side is absorbed by the second phosphor 2, and a yellow-green to orange light component located on the long-wavelength side is hardly absorbed by the second phosphor 2. As a result, the fluorescent components emitted by the first phosphor 1 shift to a longer wavelength, and therefore the light-emitting device is advantageous for the detection of brown foreign substances.

Furthermore, it is preferable that the first light component 5 include a fluorescent component having a maximum intensity value within a wavelength range of 600 nm or more and less than 660 nm. In addition, this fluorescent component is preferably derived from the first phosphor 1, which is composed of a nitride or an oxynitride activated with $Eu^{2+}$. Furthermore, the second light component 6 is preferably derived from a fluorescent component of the second phosphor 2, which has an excitation peak within a wavelength range of 600 nm or more and less than 750 nm. In this way, from among the fluorescent components emitted by the first phosphor 1, a red to dark red light component located on the long-wavelength side is absorbed by the second phosphor 2, and a yellow-green to orange light component located on the short-wavelength side is hardly absorbed by the second phosphor 2. As a result, the light-emitting device is advantageous for the detection of brown foreign substances.

Note that it is sufficient as long as the first light component 5 is derived from at least one kind of the first phosphor 1. Therefore, the first phosphor 1 may be constituted by only one kind of phosphor, or may be constituted by a plurality of kinds of phosphors.

Furthermore, it is preferable that the first light component 5 be composed of at least part of a light component emitted by a wavelength-conversion light-emitting element obtained by combining a solid-state light-emitting element and a phosphor. Furthermore, in the output light 4, it is preferable that both the first light component 5 and the third light component 7 be light components emitted by a wavelength-conversion light-emitting element. In this way, commercially available white LED light sources can be used as they are, and therefore the light-emitting device is advantageous for rapid product development and industrial production.

Here, it is preferable that the second light component 6 be derived from fluorescence emitted by a phosphor activated with $Cr^{3+}$. Furthermore, it is preferable that the second light component 6 be derived from fluorescence emitted by a phosphor having a garnet-type crystal structure. Phosphors activated with $Cr^{3+}$ are likely to have the property of absorbing visible light, particularly blue light or red light, and converting this into near-infrared fluorescence. Therefore, blue light emitted by a wavelength-conversion light-emitting element provided with a blue LED and red light emitted by a wavelength-conversion light-emitting element provided with a red phosphor can be used as excitation light, which therefore facilitates the manufacture of a light-emitting device. Furthermore, by activating with $Cr^{3+}$, it is also easy to obtain a phosphor that has an excitation peak within a wavelength range of 450 nm or more and less than 520 nm, or a phosphor having an excitation peak within a wavelength range of 600 nm or more and less than 750 nm. In addition, it is also easy to change the light absorption peak wavelength and the fluorescence peak wavelength, in other words, to change the excitation spectrum shape and the fluorescence spectrum shape, depending on the type of matrix of the phosphor to which the activator is added. Therefore, it becomes possible to easily control the spectral distribution of a near-infrared light component to be output.

Note that when near-infrared light is detected by a detector and the detection signal of the detector is subjected to a Fourier transform for use, it is preferable that the spectral distribution of the second light component 6 have a normal distribution or a spectral distribution close thereto. Therefore, it is preferable that the spectral distribution of the second light component 6 not change abruptly in intensity in the long wavelength range of 700 nm or more. Furthermore, it is more preferable that the spectral distribution of the second light component 6 not change abruptly in intensity within a wavelength range of at least 700 nm or more and less than 850 nm. Specifically, the spectral distribution of the second light component 6 preferably does not change by more than ±8%/nm, and more preferably does not change by more than ±3%/nm, in the long wavelength range of 700 nm or more. Furthermore, the spectral distribution of the second light component 6 preferably does not change by more than ±8%/nm, and more preferably does not change by more than ±3%/nm, within a wavelength range of at least 700 nm or more and less than 850 nm.

Note that a spectral distribution that is close to a normal distribution is as follows when shown numerically. In the second light component 6, a wavelength indicating the maximum intensity value is taken as $\lambda_P$, and wavelengths on the short-wavelength side and long-wavelength side where the intensity is half of said maximum intensity value are taken as $\lambda_S$ and $\lambda_L$, respectively. Here, $\lambda_P$, $\lambda_S$, and $\lambda_L$ satisfy $1 \leq (\lambda_L - \lambda_P)/(\lambda_P - \lambda_S) < 2.0$, preferably $1 \leq (\lambda_L - \lambda_P)/(\lambda_P - \lambda_S) < 1.8$. Thus, the generation of false signals after a Fourier transform is suppressed, and it becomes possible for a detection signal of excellent quality to be detected by a detector.

At least one of the first light component 5 or the third light component 7 preferably has blue-green to green to yellow to orange light of a wavelength of 510 nm or more and less than 600 nm, and more preferably has green to yellow light of a wavelength of 530 nm or more and less than 580 nm. Furthermore, it is even more preferable that at least one of the first light component 5 or the third light component 7 have green light of a wavelength of 545 nm or more and less than 565 nm. Such a first light component 5 and third light component 7 have a large intensity at which the human eye perceives light. This results in output light 4 with which it is easy for the human eye to see an irradiated object.

At least one of the first light component 5 or the third light component 7 preferably has blue to blue-green to green light of a wavelength of 460 nm or more and less than 550 nm, and more preferably has blue-green to green light of a wavelength of 480 nm or more and less than 530 nm. Furthermore, at least one of the first light component 5 or the third light component 7 even more preferably has blue-green to green light of a wavelength of 490 nm or more and less than 520 nm. Such a first light component 5 and third light component 7 have a large intensity at which the human eye perceives light in scotopic vision in which the amount of light is low. This results in output light 4 with which it is easy to see an irradiated object in the dark or the like.

At least one of the first light component 5 or the third light component 7 preferably has light of a wavelength of 610 nm or more and less than 670 nm, and more preferably has red light of a wavelength of 630 nm or more and less than 660 nm. Such a first light component 5 and third light component 7 make skin color of an irradiated object look beautiful and vivid. This results in output light 4 that improves the appearance of the face and skin of an illuminated person, and the appearance of reddish meat and fruit.

The second light component 6 preferably has a wavelength of 850 nm as a starting point and decreases in intensity as the wavelength becomes longer. Specifically, it is preferable that the second light component 6 have a fluorescence intensity at a wavelength of 1000 nm that is less than 10% of the fluorescence intensity at a wavelength of 850 nm. Furthermore, the wavelength set as the starting point is preferably shorter than 850 nm, and is preferably 800 nm, for example. In this case, it is preferable that the second light component 6 have a fluorescence intensity at a wavelength of 1000 nm that is less than 10% of the fluorescence intensity at a wavelength of 800 nm. Furthermore, it is preferable that the second light component 6 have a fluorescence intensity at a wavelength of 950 nm that is less than 10% of the fluorescence intensity at a wavelength of 800 nm. In this way, there is a reduction in the proportion of near-infrared rays and mid-infrared rays on the long-wavelength side, which tend to function as heat rays. Therefore, the light-emitting device is advantageous for inspecting objects susceptible to adverse effects from heat, such as food products.

It is preferable that the spectral distribution of the output light 4 have the first minimum value 8 between the first light component 5 and the second light component 6, and that the first minimum value 8 be less than 50% of the maximum intensity value of the second light component 6. In addition, in the second light component 6, the wavelength difference between a wavelength on the long-wavelength side and a wavelength on the low-wavelength side at which an intensity that is 50% of the maximum intensity value is obtained is preferably greater than 70 nm, and more preferably greater than 100 nm. In this way, visible light components and near-infrared light components are separated, resulting in output light 4 that has near-infrared light across a wide wavelength range. Therefore, the light-emitting device is advantageous for inspecting and evaluating objects that have different absorption wavelengths for near-infrared light or are likely to fluctuate depending on the surrounding environment.

Light obtained by mixing the first light component 5, the second light component 6, and the third light component 7 can also contain a blue light component, a blue-green to green to yellow light component, and a red light component. The blue light component is preferably a light component within a range of wavelengths of 435 nm or more and less than 480 nm, and a light component having a maximum intensity value within this wavelength range. A blue-green to green to yellow light component is preferably a light component within a range of wavelengths of 500 nm or more and less than 580 nm, and a light component having a maximum intensity value within this wavelength range. The red light component is preferably a light component within a range of wavelengths of 600 nm or more and less than 700 nm, and a light component having a maximum intensity value within this wavelength range. Thus, the output light 4 contains blue, green, and red light components, which are the three primary colors of light, and the light-emitting device can output visible light having high color rendering properties. Therefore, the light-emitting device is advantageous in making an irradiated object appear as it is. Furthermore, a large amount of light components of the three primary colors of light (blue, green, and red) and near-infrared light components are emitted, and therefore the light-emitting device has good compatibility with an imaging technique called RGB-NIR imaging.

The third light component 7 can be a blue light component having a maximum intensity value within a wavelength range of 435 nm or more and less than 480 nm, and preferably 440 nm or more and less than 470 nm, derived from the primary light 3B emitted by the solid-state light-emitting element 3. Such a third light component 7 can be easily obtained using a light-emitting diode (LED) or a laser diode that emits blue light. Therefore, the light-emitting device is advantageous for product development and industrial production.

The first light component 5 is preferably light (first wavelength-converted light 1B) obtained by subjecting the third light component 7 to wavelength conversion by the first phosphor 1. In this way, the energy difference (Stokes shift) between light absorption and fluorescence emission by the first phosphor 1 becomes small. Therefore, it is possible to suppress a phenomenon (temperature quenching) in which energy loss that occurs with the wavelength conversion causes the first phosphor 1 to generate heat, and quenching occurs due to the temperature rise of the phosphor. Therefore, the light-emitting device can output the first light component 5 with high photon conversion efficiency.

Similarly, the second light component 6 is preferably light (second wavelength-converted light 2B) obtained by subjecting the first light component 5 to wavelength conversion by the second phosphor 2. In this way, the energy difference between light absorption and fluorescence emission by the second phosphor 2 becomes small, and therefore temperature quenching of the second phosphor 2 can be suppressed. Therefore, the light-emitting device can output the second light component 6 with high photon conversion efficiency.

Note that in the output light 4, the integral value of the energy intensity in a light component of a wavelength of less than 700 nm is preferably less than half of the integral value of the energy intensity in a light component of a wavelength of 700 nm or more, and more preferably less than ⅓. In this way, the energy intensity of a light component including near-infrared light becomes greater than the energy intensity of a light component of visible light. This is therefore suitable for high-precision non-destructive inspection, non-destructive inspection of minute objects, wide-area non-destructive inspection, non-destructive inspection of large objects or thick objects, and the like, and it becomes possible to confirm the surface condition or the like of an irradiated object with the human eye, as necessary. Furthermore, the light-emitting device emits output light 4 having a small proportion of visible light components, and therefore the light-emitting device is also advantageous for mitigating glare of the output light 4.

In the light-emitting device of the present embodiment, the output light 4 can exhibit a white color. For example, a light component can be selected such that the first light component 5, the second light component 6, and the third light component 7 produce white light due to additive color mixing. In this way, the light-emitting device simultaneously emits light having a color tone close to that of natural light, and high-output near-infrared rays, which combines general lighting and industrial lighting. Therefore, the light-emitting device is suitable for a detection device that detects the state of an irradiated object, and an inspection device that inspects the internal structure and defects of an irradiated object, under a near-natural appearance.

In the present embodiment, the output light 4 preferably has a correlated color temperature of 2600 K or more and less than 12000 K, and more preferably 3000 K or more and less than 8000 K. This makes it possible to simultaneously emit visible light having a color tone close to that of natural light, and near-infrared light, and to provide both general lighting in which appearance according to the human eye is regarded as important and industrial lighting in which appearance according to sensors of electronic apparatuses is regarded as important. Therefore, the light-emitting device is suitable for a detection device that detects the state or the like of an irradiated object, and an inspection device that inspects the internal structure, defects, or the like of an irradiated object, under a near-natural appearance. Note that a light having a low correlated color temperature has a color that is close to that of light emitted by a light bulb, and light having a high correlated color temperature has a color that is close to that of daytime sunlight.

The output light 4 preferably has an average color rendering index (Ra) of 80 or more and less than 100. It is thereby possible for fruits and vegetables, meat, fresh fish, and the like to have a good appearance with a rich sense of freshness due to light having high color rendering properties. Meanwhile, the degree of damage, freshness, and the like inside these can be evaluated by detecting reflected or transmitted near-infrared light that has been radiated thereon. Therefore, the degree of damage of products displayed in a sales area can be grasped without being perceived by a third party, and products that are found to be damaged can be removed from the sales area or the like at an early stage. Furthermore, it is possible to make a person's face and skin, internal organs, and the like appear beautiful due to light having high color rendering properties. Meanwhile, the health condition, diseases, and the like of a person can be evaluated by detecting reflected or transmitted near-infrared light that has been radiated thereon. Note that light having a low average color rendering index is light that is advantageous for increasing luminous flux, and light with a high average color rendering index is light that is close to natural light.

In this way, with the light-emitting device of the present embodiment, it is possible to monitor and measure the state of an irradiated object by means of near-infrared light without being perceived by a person, while giving an appearance to a space that compares favorably to when illuminated by natural light.

The output light 4 exhibiting a white color preferably has a spectral intensity over the entire wavelength range of 440 nm or more and less than 660 nm, preferably 430 nm or more and less than 900 nm. That is, the output light 4 preferably has a spectral distribution in which there is no wavelength component having an intensity of zero, in the above wavelength range. Such output light 4 can illuminate a target object with light that has many different wavelengths and ranges from short-wavelength visible (violet-blue) to near-infrared. Therefore, the light-emitting device is advantageous for hyperspectral imaging, which captures and aggregates reflected light that varies according to wavelength, and visualizes features of the irradiated object.

In the spectral distribution of the output light 4, it is preferable that the intensity of long-wavelength light components of a wavelength of 700 nm or more exhibit a maximum value. In particular, in the spectral distribution of the output light 4, the maximum intensity value of light components of a wavelength of at least 700 nm preferably exceeds 1.5 times, more preferably exceeds 2 times, and even more preferably exceeds 3 times the maximum intensity value of light components of a wavelength of 380 nm or more and less than 700 nm. Furthermore, in the spectral distribution of the output light 4, the maximum intensity value of light components within a wavelength range of 380 nm or more and less than 700 nm is preferably less than 50%, more preferably less than 30%, and even more preferably less than 10% of the maximum intensity value of light components of a wavelength of 700 nm or more. In this way, due to the conversion efficiency to near-infrared light components being high, the light-emitting device has a large proportion of near-infrared light components.

Note that the spectral distribution of the output light 4 preferably is substantially free of light components in the ultraviolet range of a wavelength of less than 380 nm. Thus, input power can be converted only into visible light and infrared light, and the light-emitting device has high energy conversion efficiency into visible light and infrared light.

The spectral distribution of the output light 4 preferably has a broad fluorescent component derived from a $^4T_2 \rightarrow ^4A_2$ electron energy transition of $Cr^{3+}$ ions, such as that exhibited as the second light component 6. Also, this fluorescent component preferably has a fluorescence peak in the wavelength range of 700 nm or more. Thus, a near-infrared light component is emitted over a wide wavelength range, and the light-emitting device is suitable for hyperspectral imaging.

The spectral distribution of the output light 4 preferably has light components over the entire visible wavelength range of at least 410 nm or more and less than 700 nm, and preferably 380 nm or more and less than 780 nm. Thus, not only does the irradiated object become visible to the human eye, but it is also possible to have light components that can be used for spectral imaging, over the entire visible wavelength range.

Note that, as described later, in the light-emitting device, the solid-state light-emitting element 3 and a first wavelength converter 1A can be combined to form a wavelength-conversion light-emitting element. Wavelength-conversion light-emitting elements that emit light of a correlated color temperature of 2600 K or more and less than 12000 K are widely available in the market as white LEDs in products of a variety of specifications and forms. Therefore, by using a wavelength-conversion light-emitting element, the process from design to product development and industrial production can be adapted quickly to customer requests with few man-hours.

(Configuration of Light-Emitting Device)

Figure 2:
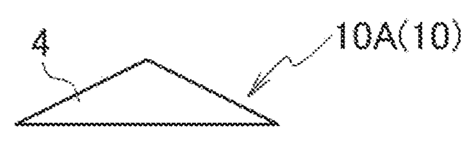
FIG. 2 is a schematic view illustrating an example of the configuration of the light-emitting device according to an embodiment herein.
Figure 2:
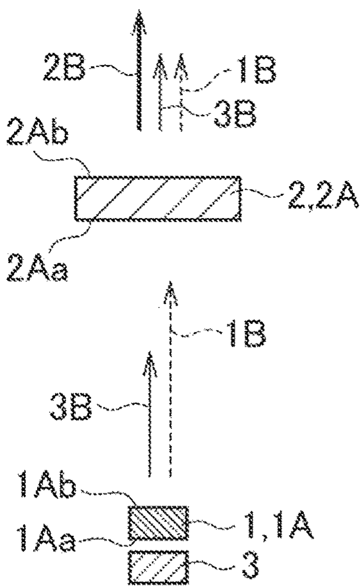
Figure 3:
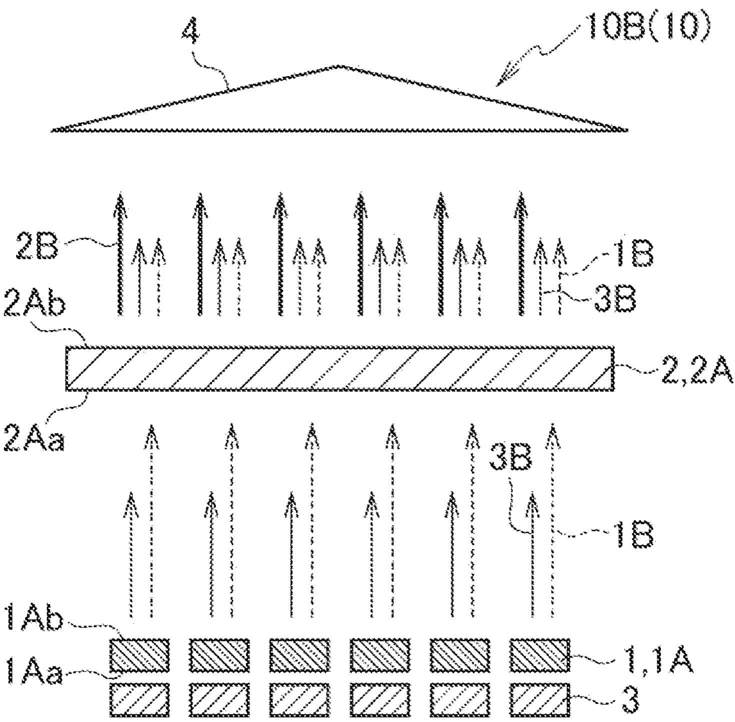
FIG. 3 is a schematic view illustrating another example of the configuration of the light-emitting device according to an embodiment herein.
Figure 4:
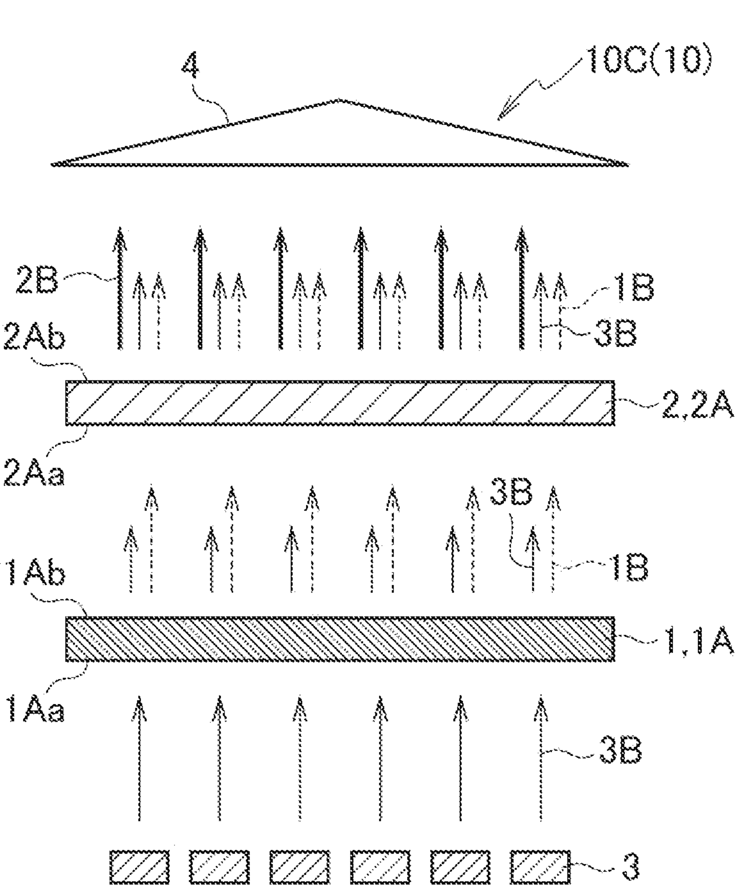
FIG. 4 is a schematic view illustrating another example of the configuration of the light-emitting device according to an embodiment herein.
Figure 5:
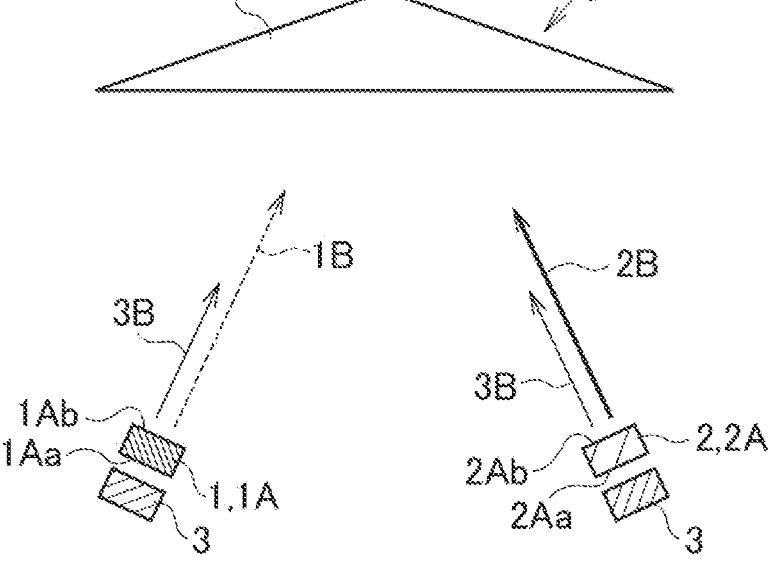
FIG. 5 is a schematic view illustrating another example of the configuration of the light-emitting device according to an embodiment herein.

FIGS. 2 to 5 illustrate the configuration of a light-emitting device 10 according to the present embodiment. FIG. 2 illustrates a light-emitting device 10A using one of each of the solid-state light-emitting element 3, the first wavelength converter 1A, and a second wavelength converter 2A. FIG. 3 illustrates a light-emitting device 10B using a plurality of first wavelength-conversion light-emitting elements in which the solid-state light-emitting element 3 and the first wavelength converter 1A are combined, and also one second wavelength converter 2A. FIG. 4 illustrates a light-emitting device 10C in which a plurality of solid-state light-emitting elements 3 and one of each of the first wavelength converter 1A and the second wavelength converter 2A are combined. FIG. 5 illustrates a light-emitting device 10D using the first wavelength-conversion light-emitting element in which the solid-state light-emitting element 3 and the first wavelength converter 1A are combined, and a second wavelength-conversion light-emitting element in which the solid-state light-emitting element 3 and the second wavelength converter 2A are combined. Note that FIGS. 2 to 5 omit power sources and the like that are constituent elements of a light-emitting device.

As illustrated in FIGS. 2 to 5, the light-emitting device 10 is a light-emitting device that is provided with the solid-state light-emitting element 3, the first wavelength converter 1A including the first phosphor 1, and the second wavelength converter 2A including the second phosphor 2, and that emits the output light 4. Note that the light-emitting device 10 may be a wavelength converter in which at least one of the first wavelength converter 1A or the second wavelength converter 2A includes both the first phosphor and the second phosphor.

In the light-emitting device 10, the solid-state light-emitting element 3 emits the primary light 3B. The first wavelength converter 1A absorbs at least part of the primary light 3B and converts this into the first wavelength-converted light 1B having a fluorescence peak within the visible wavelength range of 380 nm or more and less than 700 nm. The second wavelength converter 2A absorbs part of at least one of the primary light 3B or the first wavelength-converted light 1B and converts this into the second wavelength-converted light 2B. The second wavelength-converted light 2B has a fluorescence peak in the wavelength range exceeding 700 nm, preferably 750 nm. In addition, the second wavelength-converted light 2B has a near-infrared light component within a wavelength range of 700 nm or more and less than 2500 nm, and preferably 780 nm or more and less than 1000 nm. With a device configuration such as this, it is possible to emit the output light 4 including the first light component 5 derived from the first wavelength-converted light 1B, the second light component 6 derived from the second wavelength-converted light 2B, and the third light component 7 derived from the primary light 3B.

The light-emitting device 10 can have a transmissive configuration such as that illustrated in FIGS. 2 to 4. Specifically, the first wavelength converter 1A receives the primary light 3B at a front surface 1Aa, and radiates the primary light 3B and the first wavelength-converted light 1B from a back surface 1Ab. In addition, the second wavelength converter 2A receives the primary light 3B and the first wavelength-converted light 1B at a front surface 2Aa, and radiates the primary light 3B, the first wavelength-converted light 1B, and the second wavelength-converted light 2B from a back surface 2Ab. With this configuration, mixed light of the first wavelength-converted light 1B, the second wavelength-converted light 2B, and the primary light 3B is output from a common output surface in the light-emitting device.

Specifically, in the light-emitting devices 10A, 10B, and 10C, the primary light 3B emitted by the solid-state light-emitting element 3 is radiated on both the first wavelength converter 1A and the second wavelength converter 2A. Therefore, it is preferable that the first wavelength converter 1A and the second wavelength converter 2A have a structure that transmits both the primary light 3B and the first wavelength-converted light 1B. That is, it is preferable that a structure be adopted in which both the primary light 3B and the first wavelength-converted light 1B can pass through the first wavelength converter 1A and the second wavelength converter 2A and be output from the light-emitting device together with the second wavelength-converted light 2B. Thus, the light output surface from which the output light 4 is emitted is within the range of that having the larger area in the first wavelength converter 1A and the second wavelength converter 2A, and therefore the size of the light-emitting device can be reduced.

Note that in the light-emitting device 10C illustrated in FIG. 4, the first wavelength converter 1A is arranged at the side close to the solid-state light-emitting element 3, and the second wavelength converter 2A is arranged at the side far therefrom. However, the arrangement of the first wavelength converter 1A and the second wavelength converter 2A can also be reversed.

As illustrated in FIG. 5, the light-emitting device 10 can also be a configuration having a parallel arrangement of the first wavelength-conversion light-emitting element in which the solid-state light-emitting element 3 and the first wavelength converter 1A are combined, and the second wavelength-conversion light-emitting element in which the solid-state light-emitting element 3 and the second wavelength converter 2A are combined. In this case, the first wavelength converter 1A receives the primary light 3B at the front surface 1Aa, and radiates the primary light 3B and the first wavelength-converted light 1B from the back surface 1Ab. Furthermore, the second wavelength converter 2A receives the primary light 3B at the front surface 2Aa, and radiates the primary light 3B and the second wavelength-converted light 2B from the back surface 2Ab. Mixed light of the first wavelength-converted light 1B, the second wavelength-converted light 2B, and the primary light 3B is then output from an output surface in the light-emitting device 10D.

<Solid-State Light-Emitting Element>

The solid-state light-emitting element 3 is a light-emitting element that radiates the primary light 3B, and is preferably a light-emitting diode or a laser diode. Note that the solid-state light-emitting element 3 is not limited thereto, and various kinds of light-emitting elements can be used as long as they are capable of emitting the primary light 3B.

By using an LED module or a laser diode that emits high-energy light of 1 W or more as the solid-state light-emitting element 3, the light-emitting device 10 can be expected to have a light output including a near-infrared light component of a several hundred mW class. By using an LED module that emits light of 3 W or more or 10 W or more as the solid-state light-emitting element 3, the light-emitting device 10 can be expected to have a light output of a several W class. By using an LED module that emits light of 30 W or more as the solid-state light-emitting element 3, the light-emitting device 10 can be expected to have a light output exceeding 10 W. By using an LED module that emits light of 100 W or more as the solid-state light-emitting element 3, the light-emitting device 10 can be expected to have a light output exceeding 30 W.

Using a laser diode for the primary light 3B to be laser light results in a specification in which the first wavelength converter 1A is irradiated with high-density spotlight. Thus, the light-emitting device 10 becomes a high-output point light source, and it therefore becomes possible to expand the range of industrial uses of solid-state lighting. Note that as a laser diode, for example, it is possible to use an edge emitting laser (EEL), a vertical cavity surface emitting laser (VCSEL), or the like.

Providing the light-emitting device 10 with a light guide member such as an optical fiber results in a structure in which the solid-state light-emitting element 3 is spatially separated from the first wavelength converter 1A and the second wavelength converter 2A. Thus, the light-emitting part is light-weight and can be moved freely, and in the light-emitting device it is easy for the irradiated location to be freely changed.

There is preferably a plurality of solid-state light-emitting elements 3. Thus, the output of the primary light 3B can be increased, and the light-emitting device is advantageous for increasing output. Note that although the number of solid-state light-emitting elements is not particularly limited, there may be 9 or more, 16 or more, 25 or more, 36 or more, 49 or more, 64 or more, 81 or more, or 100 or more, for example. Furthermore, although the upper limit for the number of solid-state light-emitting elements is also not particularly limited, this may be, 9, 16, 25, 36, 49, 64, 81, or 100, for example.

In the light-emitting device 10, the solid-state light-emitting element 3 is preferably a surface emitting type of surface emitting light source. Thus, variations in intensity distribution and unevenness in color tone of the primary light 3B radiated on the first wavelength converter 1A are suppressed, and therefore the light-emitting device is advantageous for suppressing uneven intensity in output light.

The light energy density of the primary light 3B emitted by the solid-state light-emitting element 3 preferably exceeds 0.3 W/mm$^2$, and more preferably exceeds 1.0 W/mm$^2$. In this way, because the light energy density of the primary light 3B is high, when a configuration is adopted in which the first wavelength converter 1A is irradiated with primary light 3B that is diffused, comparatively intense output light 4 can be emitted. Furthermore, if a configuration is adopted in which the first wavelength converter 1A is directly irradiated with primary light 3B that is not diffused, output light 4 having a high light energy density can be emitted. Note that although the upper limit for the light energy density of the primary light 3B emitted by the solid-state light-emitting element 3 is not particularly limited, it can be 30 W/mm$^2$, for example.

It is sufficient as long as the primary light 3B is light with which at least part thereof can be absorbed by the first wavelength converter 1A and converted into the first wavelength-converted light 1B having a fluorescence peak within a wavelength range of 380 nm or more and less than 780 nm. Specifically, the primary light 3B can be selected from long-wavelength ultraviolet rays (UV-A: 315 nm or more and less than 400 nm), violet or blue (380 nm or more and less than 495 nm), green or yellow (495 nm or more and less than 590 nm), and orange or red (590 nm or more and less than 750 nm).

The primary light 3B is preferably light having a maximum intensity value within a wavelength range of wavelengths of 435 nm or more and less than 560 nm, and particularly within a wavelength range of wavelengths of 440 nm or more and less than 480 nm. In this way, an orthodox blue LED or a white LED with a blue LED specification can be used, therefore facilitating rapid product development and industrial production.

Note that in the primary light 3B, it is preferable that photons constituting the primary light be supplied from a plurality of solid-state light-emitting elements. In this way, the first wavelength converter 1A can be supplied with many photons in proportion to the number of solid-state light-emitting elements 3, therefore resulting in a light-emitting device that is advantageous for increasing the output of the output light 4.

<First Wavelength Converter>

The first wavelength converter 1A can be a wavelength converter in which the first phosphor 1 is sealed with a silicone resin. Furthermore, the first wavelength converter 1A can be an all-inorganic wavelength converter in which the first phosphor 1 is sealed with a low-melting-point glass. In addition, the first wavelength converter 1A can also be an all-inorganic wavelength converter composed mainly of the first phosphor 1 with a binding material or the like being used. The first wavelength converter 1A can also be a sintered body obtained by sintering the first phosphor 1, that is, a fluorescent ceramic. Also, a form in which such wavelength converters are combined can also be implemented, and for example, a structure in which such wavelength converters are stacked can also be implemented.

Note that a wavelength converter sealed with resin is comparatively easy to manufacture using powder phosphor, therefore resulting in the light-emitting device being comparatively inexpensive. However, all-inorganic wavelength converters have excellent thermal conductivity and make it easy to design for heat dissipation, and therefore the light-emitting device can output at high watts with a rise in the temperature of the wavelength converters being suppressed.

Note that although the thickness of the first wavelength converter 1A is not particularly limited, the maximum thickness is preferably 100 μm or more and less than 5 mm, and more preferably 200 μm or more and less than 1 mm.

The first wavelength converter 1A is preferably arranged so as to cover the entire light output surface of the solid-state light-emitting element 3, and more preferably so as to cover the entire light output surface of a surface emitting light source. This results in a configuration in which the first wavelength converter 1A is efficiently irradiated with the primary light 3B, and it therefore becomes possible to increase the efficiency of the conversion of the primary light 3B to the first wavelength-converted light 1B.

The first wavelength converter 1A is preferably translucent. Thus, a light component that has been wavelength-converted inside the wavelength converter can pass through the first wavelength converter 1A and be emitted.

<First Phosphor>

The first phosphor 1 is a phosphor that absorbs and converts the primary light 3B into the first wavelength-converted light 1B. Various inorganic phosphors known as being used for solid-state illumination light sources can be used as the first phosphor 1.

For example, by using, as the first phosphor 1, a phosphor that emits blue wavelength-converted light exhibiting a maximum intensity value within a wavelength range of 435 nm or more and less than 500 nm, the output light 4 contains a blue light component. By using, as the first phosphor 1, a phosphor that emits blue-green or green wavelength-converted light exhibiting a maximum intensity value within a wavelength range of 470 nm or more and less than 530 nm, the output light 4 contains a blue-green light component. By using, as the first phosphor 1, a phosphor that emits green or yellow-green wavelength-converted light exhibiting a maximum intensity value within a wavelength range of 500 nm or more and less than 560 nm, the output light 4 contains a green light component. By using, as the first phosphor 1, a phosphor that emits yellow or orange wavelength-converted light exhibiting a maximum intensity value within a wavelength range of 560 nm or more and less than 600 nm, the output light 4 contains a yellow light component. Furthermore, by using, as the first phosphor 1, a phosphor that emits red or dark red wavelength-converted light exhibiting a maximum intensity value within a wavelength range of 600 nm or more and less than 700 nm, and particularly 610 nm or more and less than 660 nm, the output light 4 contains a red light component.

Note that using a phosphor that emits blue-green light having a high visibility in scotopic vision results in output light 4 that is easily visible in dimly lit conditions or the dark. Furthermore, using a phosphor that emits green light having a high visibility in photopic vision results in output light 4 that is easily visible in bright places. Using a phosphor that emits yellow light results in output light 4 for use in a work environment where resins that are likely to be exposed to ultraviolet rays and blue light are used. Furthermore, using a phosphor that emits red light results in output light 4 that gives a good appearance to reddish meat, tuna, apples, and the like, or a person's skin or the like.

As the first phosphor 1, a phosphor that is activated with at least one of a rare earth ion or a transition metal ion and emits visible fluorescence can be used. The rare earth ion is preferably at least one of $Ce^{3+}$ or $Eu^{2+}$. The transition metal ion is preferably $Mn^{4+}$. Also, the first phosphor 1 is preferably an oxide, sulfide, nitride, halide, oxysulfide, oxynitride, or acid halide containing the fluorescent ion (light emission center).

To describe in detail, the first phosphor 1 is preferably at least one selected from the group consisting of halophosphates, phosphates, halosilicates, silicates, aluminates, aluminosilicates, borates, germanates, silicate nitrides, aluminosilicate nitrides, silicate oxynitrides, and aluminosilicate oxynitrides. Also, from these, the first phosphor 1 may be used by selecting one that is suitable for the lighting design as appropriate.

Note that, from the viewpoint of suppressing the Stokes loss of absorbed light that accompanies wavelength conversion by the second wavelength converter 2A, the first phosphor 1 preferably emits wavelength-converted light that exhibits a maximum intensity value in the longest wavelength possible. Therefore, the first phosphor 1 preferably includes a red phosphor that emits light having a maximum intensity value within a wavelength range of 600 nm or more and less than 660 nm. Thus, the second phosphor 2 included in the second wavelength converter 2A can be excited using red light. Therefore, the Stokes loss brought about by the second wavelength converter 2A is reduced and the temperature quenching of the second phosphor 2 can be suppressed.

The red phosphor is preferably a composite nitride phosphor or a composite oxynitride phosphor activated with $Eu^{2+}$. Possible examples of such $Eu^{2+}$ activated nitride-based phosphors include phosphors of alkaline earth metal nitride silicate, alkaline earth metal aluminosilicate nitride, alkaline earth metal oxynitride silicate, and alkaline earth metal aluminosilicate oxynitride. Furthermore, possible examples of $Eu^{2+}$ activated nitride-based phosphors include $MAlSiN_3:Eu^{2+}$, $MAlSi_4N_7:Eu^{2+}$, and $M_2Si_5N_8:Eu^{2+}$. Note that M is at least one element selected from the group consisting of Ca, Sr, and Ba. In addition, another possible example of an $Eu^{2+}$ activated nitride-based phosphor is a phosphor in which part of the $Si^{4+}$—$N^3$ combination in the above compound compositions is replaced with $Al^{3+}$—$O^{2-}$.

Many $Eu^{2+}$ activated nitride-based phosphors have the property of absorbing light components over a wide wavelength range of blue to green to yellow to orange and converting them into red light. Therefore, a solid-state light-emitting element that emits not only blue light but also green light and yellow light can be used as the solid-state light-emitting element 3. Therefore, it is easy to reduce the Stokes loss that occurs when performing wavelength conversion to near-infrared rays, and it becomes possible to increase the efficiency of the output light 4.

From the viewpoint of suppressing fluorescence output saturation of the first wavelength converter 1A and supplying many photons to the second wavelength converter 2A, it is preferable that the first wavelength converter 1A include the first phosphor 1 having a short afterglow. Therefore, it is also preferable that the first phosphor 1 included in the first wavelength converter 1A be only a phosphor activated with $Ce^{3+}$.

$Ce^{3+}$ exhibits light absorption and fluorescence emission that are based on parity-allowed and spin-allowed electron energy transitions, which results in light absorption and fluorescence emission occurring instantaneously. Therefore, since fluorescence output saturation is difficult even under the radiation of high-density excitation light, the output of the output light 4 can be increased by increasing the number of photons of the primary light 3B radiated directly on the first wavelength converter 1A.

The phosphor activated with $Ce^{3+}$ is preferably a composite oxide phosphor having a garnet-type crystal structure ($Ce^{3+}$ activated garnet phosphor). Possible examples of a $Ce^{3+}$ activated garnet phosphor include rare earth aluminum garnet phosphors, rare earth silicon garnet phosphors, and garnet compounds as solid solutions obtained with these as end components. Possible examples of rare earth aluminum garnet phosphors include $Lu_3Al_2(AlO_4)_3:Ce^{3+}$, $Y_3Al_2(AlO_4)_3:Ce^{3+}$, $Lu_3Ga_2(AlO_4)_3:Ce^{3+}$, and $Y_3Ga_2(AlO_4)_3:Ce^{3+}$. A possible example of a rare earth silicon garnet phosphor is $Lu_2CaMg_2(SiO_4)_3:Ce^{3+}$.

There are many $Ce^{3+}$ activated garnet phosphors that have the property of absorbing blue light, and therefore a solid-state light-emitting element that emits blue light can be used as the solid-state light-emitting element 3 that emits the primary light 3B. Furthermore, there are also many $Ce^{3+}$ activated garnet phosphors that have the property of converting absorbed light into green light, and therefore it becomes easy to obtain output light 4 having high color rendering properties. In addition, there are also many $Ce^{3+}$ activated garnet phosphors that have the property of converting absorbed light into orange light, and therefore it becomes possible to obtain output light 4 including a red light component, which is advantageous for the detection of red-tinged objects. Furthermore, along with progress in vehicle-mounted headlamp technology, high-power projector technology, and the like, in recent years there has also been progress in technology for ceramic conversion of a $Ce^{3+}$ activated garnet phosphor which is advantageous for increasing output and ensuring reliability. Therefore, it is also comparatively easy to, for example, provide devices that use fluorescent ceramics and are advantageous in terms of increasing output and reliability.

In this way, by using the first phosphor 1, the first wavelength-converted light 1B becomes a visible light component having a maximum intensity value within a range of wavelengths of 435 nm or more and less than 700 nm. For example, the first wavelength-converted light 1B becomes light having a maximum intensity value within a range of wavelengths of 500 nm or more and less than 600 nm, and particularly 510 nm or more and less than 560 nm. Furthermore, the first wavelength-converted light 1B becomes light having a maximum intensity value within a range of wavelengths of 600 nm or more and less than 660 nm, and particularly 610 nm or more and less than 650 nm.

<Second Wavelength Converter>

The second wavelength converter 2A can be a wavelength converter in which the second phosphor 2 is sealed with a silicone resin. Furthermore, the second wavelength converter 2A can be an all-inorganic wavelength converter in which the second phosphor 2 is sealed with a low-melting-point glass. In addition, the second wavelength converter 2A can be an all-inorganic wavelength converter composed mainly of the second phosphor 2 with a binding material or the like being used. The second wavelength converter 2A can also be a sintered body obtained by sintering the second phosphor 2, that is, a fluorescent ceramic. Note that the form of the second wavelength converter 2A is similar to that of the first wavelength converter 1A, and therefore overlapping descriptions are omitted.

The second wavelength converter 2A is preferably arranged so as to cover the entirety of the first wavelength converter 1A. Thus, the primary light 3B having passed through the first wavelength converter 1A and the first wavelength-converted light 1B emitted from the first wavelength converter 1A are efficiently radiated on the second wavelength converter 2A. Therefore, it is possible to increase the efficiency of conversion from the primary light 3B and the first wavelength-converted light 1B to the second wavelength-converted light 2B.

The second wavelength converter 2A is preferably translucent. Thus, in addition to the primary light 3B and the first wavelength-converted light 1B, a light component that has been wavelength-converted inside the wavelength converter can also pass through the second wavelength converter 2A and be emitted. Furthermore, the second wavelength converter 2A preferably transmits the second wavelength-converted light 2B, particularly light of a wavelength of 750 nm. Thus, the second wavelength converter 2A transmits a near-infrared light component, and therefore, inside the wavelength converter, photons are suppressed from being absorbed and lost in the wavelength converter itself.

<Second Phosphor>

The second phosphor 2 is a phosphor that absorbs at least one of the primary light 3B or the first wavelength-converted light 1B and converts this into the second wavelength-converted light 2B. For example, various inorganic phosphors (near-infrared phosphors) known as being used for near-infrared light sources can be used as the second phosphor 2.

As the second phosphor 2, a phosphor that emits near-infrared light on the comparatively short-wavelength side exhibiting a maximum intensity value within a wavelength range of 700 nm or more and less than 1700 nm can be used. Thus, the output light 4 can contain light components having light absorption wavelengths for various gas molecules (for example, $O_2$: 760 nm, $NO_2$: 830 nm, $H_2O$: 1365 nm, $NH_3$: 1530 nm, $C_2H_2$: 1530 nm, CO: 1567 nm, $CO_2$: 1573 nm, and $CH_4$: 1651 nm). At this time, the primary light 3B or the first wavelength-converted light 1B are preferably light exhibiting a maximum intensity value within a wavelength range of 380 nm or more and less than 700 nm, particularly light exhibiting a maximum intensity value within a wavelength range of 440 nm or more and less than 500 nm, light exhibiting a maximum intensity value within a wavelength range of 500 nm or more and less than 580 nm, or light exhibiting a maximum intensity value within a wavelength range of 600 nm or more and less than 680 nm.

Here, near-infrared spectroscopy can be used to obtain information regarding oxygen ($O_2$), nitrogen dioxide ($NO_2$), and objects containing these components. Thus, the second phosphor 2 used for such a purpose is preferably a phosphor that emits wavelength-converted light exhibiting a maximum intensity value within a wavelength range of more than 700 nm and less than 900 nm, and preferably within a wavelength range of more than 750 nm and less than 850 nm.

Near-infrared spectroscopy can be used to obtain information regarding water ($H_2O$) and objects containing water. Thus, the second phosphor 2 used for such a purpose is preferably a phosphor that emits wavelength-converted light exhibiting a maximum intensity value within a wavelength range of more than 1200 nm and less than 1500 nm, and preferably within a wavelength range of more than 1275 nm and less than 1425 nm.

Near-infrared spectroscopy can be used to obtain information regarding ammonia ($NH_3$), hydrocarbons ($C_2H_2$, $CH_4$, and the like), carbon oxides (CO, $CO_2$, and the like), and objects containing these components. Thus, the second phosphor 2 used for such a purpose is preferably a phosphor that emits wavelength-converted light exhibiting a maximum intensity value within a wavelength range of more than 1400 nm and less than 1800 nm, and preferably within a wavelength range of more than 1500 nm and less than 1700 nm.

Conversely, there may be an adverse effect on objects or systems due to the second wavelength-converted light 2B emitted from the second phosphor 2 being absorbed by oxygen or nitrogen dioxide. In this case, as the second phosphor 2, it is preferable to use a phosphor in which the maximum intensity value within a wavelength range of more than 750 nm and less than 850 nm does not satisfy 10% of the maximum intensity value within a wavelength range of 700 nm or more and less than 1700 nm. Furthermore, as the second phosphor 2, it is preferable to use a phosphor in which the maximum intensity value within a wavelength range of more than 700 nm and less than 900 nm does not satisfy 10% of the maximum intensity value within a wavelength range of 700 nm or more and less than 1700 nm. In addition, as the second phosphor 2, it is more preferable to use a phosphor having no light component within a wavelength range of more than 700 nm and less than 900 nm.

Furthermore, there may be an adverse effect on objects or systems due to the second wavelength-converted light 2B emitted from the second phosphor 2 being absorbed by water. In this case, as the second phosphor 2, it is preferable to use a phosphor in which the maximum intensity value within a wavelength range of more than 1275 nm and less than 1425 nm does not satisfy 10% of the maximum intensity value within a wavelength range of 700 nm or more and less than 1700 nm. Furthermore, as the second phosphor 2, it is preferable to use a phosphor in which the maximum intensity value within a wavelength range of more than 1200 nm and less than 1500 nm does not satisfy 10% of the maximum intensity value within a wavelength range of 700 nm or more and less than 1700 nm. In addition, as the second phosphor 2, it is more preferable to use a phosphor having no light component within a wavelength range of more than 1200 nm and less than 1500 nm.

There may be an adverse effect on objects or systems due to the second wavelength-converted light 2B emitted from the second phosphor 2 being absorbed by ammonia, hydrocarbons, and carbon oxides. In this case, as the second phosphor 2, it is preferable to use a phosphor in which the maximum intensity value within a wavelength range of more than 1500 nm and less than 1700 nm does not satisfy 10% of the maximum intensity value within a wavelength range of 700 nm or more and less than 1700 nm. Furthermore, as the second phosphor 2, it is preferable to use a phosphor in which the maximum intensity value within a wavelength range of more than 1400 nm and less than 1800 nm does not satisfy 10% of the maximum intensity value within a wavelength range of 700 nm or more and less than 1700 nm. In addition, as the second phosphor 2, it is more preferable to use a phosphor having no light component within a wavelength range of more than 1400 nm and less than 1800 nm.

Note that a light-emitting device using a phosphor that emits near-infrared wavelength-converted light as the second phosphor 2 outputs a light component having the high spectral sensitivity of a photodiode. Also, photodiodes are used exclusively in sensors for detectors. Therefore, such light-emitting devices can be suitably used in inspection devices that use photodiodes.

For example, for an inspection device using an Si photodiode or an Si—PIN photodiode, the second phosphor 2 is preferably a phosphor that emits wavelength-converted light exhibiting a maximum intensity value within a wavelength range of 700 nm or more and less than 1100 nm. Furthermore, in this case, the second phosphor 2 is more preferably a phosphor that emits wavelength-converted light exhibiting a maximum intensity value within a wavelength range of 780 nm or more and less than 1050 nm, particularly within a wavelength range of 800 nm or more and less than 1000 nm.

For example, for an inspection device using a Ge photodiode, the second phosphor 2 is preferably a phosphor that emits wavelength-converted light exhibiting a maximum intensity value within a wavelength range of 700 nm or more and less than 1600 nm. Furthermore, in this case, the second phosphor 2 is more preferably a phosphor that emits wavelength-converted light exhibiting a maximum intensity value within a wavelength range of 1100 nm or more and less than 1550 nm, particularly 1300 nm or more and less than 1500 nm.

For example, for an inspection device using an InGaAs photodiode, the second phosphor 2 is preferably a phosphor that emits wavelength-converted light exhibiting a maximum intensity value within a wavelength range of 900 nm or more and less than 1650 nm. Furthermore, in this case, the second phosphor 2 is more preferably a phosphor that emits wavelength-converted light exhibiting a maximum intensity value within a wavelength range of 1000 nm or more and less than 1600 nm, particularly 1100 nm or more and less than 1600 nm.

In addition, a light-emitting device that uses a phosphor that emits near-infrared light on the comparatively short-wavelength side as the second phosphor 2 has a low possibility of outputting a light component of a wavelength of 4000 nm or more that becomes a heat ray. Therefore, such a light-emitting device can be suitably used for the inspection of objects that are easily altered by heat.

As the second phosphor 2, a phosphor that is activated with at least one of a rare earth ion or a transition metal ion and emits fluorescence including a near-infrared light component can be used. The rare earth ion is preferably at least one selected from the group consisting of $Nd^{3+}$, $Eu^{2+}$, $Ho^{3+}$, $Er^{3+}$, $Tm^{3+}$, and $Yb^{3+}$. The transition metal ion is preferably at least one selected from the group consisting of $Ti^{3+}$, $V^{4+}$, $Cr^{4+}$, $V^{3+}$, $Cr^{3+}$, $V^{2+}$, $Mn^{4+}$, $Fe^{3+}$, $Co^{3+}$, $Co^{2+}$, and $Ni^{2+}$. Also, similar to the first phosphor 1, as the second phosphor 2, it is possible to use a phosphor containing the aforementioned ions as the light emission center and containing at least one of an oxide, sulfide, nitride, halide, oxysulfide, oxynitride, or acid halide as the matrix.

Note that an ion functioning as a fluorescent ion in the second phosphor 2 can be at least one of the aforementioned rare earth ion or transition metal ion. Also, it is sufficient as long as the fluorescent ion has the property of absorbing at least one of the primary light 3B or the first wavelength-converted light 1B and converting this into a near-infrared light component. However, the preferred fluorescent ion is $Cr^{3+}$. That is, the second phosphor 2 preferably contains $Cr^{3+}$ as a fluorescent ion.

Due to the use of $Cr^{3+}$ as the fluorescent ion, it becomes easy to obtain a second phosphor 2 having the property of absorbing visible light, particularly blue light or red light, and converting this into a near-infrared light component. Furthermore, it also becomes easy to change the light absorption peak wavelength and fluorescence peak wavelength depending on the type of matrix, which is advantageous in changing the excitation spectrum shape and fluorescence spectrum shape. Furthermore, due to the use of $Cr^{3+}$, blue light emitted by a wavelength-conversion light-emitting element provided with a blue LED and red light emitted by a wavelength-conversion light-emitting element provided with a red phosphor can be used as excitation light, which therefore facilitates the manufacture of a light-emitting device. In addition, the light-emitting device is advantageous also when controlling the spectral distribution of the near-infrared light component to be output.

Note that the type of phosphor in which the fluorescent ion is $Cr^{3+}$ is not particularly limited as long as at least one of the primary light 3B or the first wavelength-converted light 1B is absorbed and converted into an infrared fluorescent component. However, a possible example of a $Cr^{3+}$ activated phosphor is a composite metal oxide, which is easy to manufacture.

A phosphor that is preferable as the second phosphor 2 is a composite oxide phosphor that has been used in many practical applications, has a garnet-type crystal structure, and has been activated with $Cr^{3+}$. A rare earth aluminum garnet phosphor is preferable as such a $Cr^{3+}$ activated garnet phosphor. Specifically, the $Cr^{3+}$ activated garnet phosphor is preferably at least one selected from the group consisting of $Y_3Al_2(AlO_4)_3$:$Cr^{3+}$, $La_3Al_2(AlO_4)_3$:$Cr^{3+}$, $Gd_3Al_2(AlO_4)_3$:$Cr^{3+}$, $Y_3Ga_2(AlO_4)^3$:$Cr^{3+}$, $La_3Ga_2(AlO_4)^3$:$Cr^{3+}$, $Gd_3Ga_2(AlO_4)_3$:$Cr^{3+}$, $Y_3Sc_2(AlO_4)^3$:$Cr^{3+}$, $La_3Sc_2(AlO_4)_3$:$Cr^{3+}$, $Gd_3Sc_2(AlO_4)^3$:$Cr^{3+}$, $Y_3Ga_2(GaO_4)_3$:$Cr^{3+}$, $La_3Ga_2(GaO_4)_3$:$Cr^{3+}$, $Gd_3Ga_2(GaO_4)_3$:$Cr^{3+}$, $Y_3Sc_2(GaO_4)^3$:$Cr^{3+}$, $La_3Sc_2(GaO_4)_3$:$Cr^{3+}$, and $Gd_3Sc_2(GaO_4)_3$:$Cr^{3+}$. Furthermore, the $Cr^3$ activated garnet phosphor may also be a solid solution obtained with these phosphors as end components.

Many $Cr^{3+}$ activated garnet phosphors have the property of absorbing blue light or red light and converting this into light that is dark red to near infrared. Therefore, a solid-state light-emitting element that emits blue light and/or red light can be used as the solid-state light-emitting element 3. Furthermore, a phosphor that emits a light component of blue light and/or red light can be used as the first wavelength converter 1A. Thus, output light 4 that includes at least one kind of light component (blue or red) making up the three primary colors of light (blue, green, and red) and a near-infrared light component can be obtained.

In particular, the solid-state light-emitting element 3 is a solid-state light-emitting element that emits blue light. The first wavelength converter 1A is a wavelength converter including a $Ce^{3+}$ activated garnet phosphor that converts blue light to green light and/or an $Eu^{2+}$ activated nitride-based phosphor that converts blue light to red light. In addition, the second wavelength converter 2A is a wavelength converter including a $Cr^{3+}$ activated garnet phosphor that converts the primary light 3B and/or the first wavelength-converted light 1B to near-infrared light. Thus, light components making up the three primary colors of light (blue, green, and red) and a near-infrared light component are included, and output light 4 having high color rendering properties can be obtained.

Furthermore, in recent years, materials technology related to $Ce^{3+}$ activated garnet phosphors has been advancing, including ceramic conversion technology. Therefore, it is also easy to apply the technologies fostered with $Ce^{3+}$ activated garnet phosphors to $Cr^{3+}$ activated garnet phosphors. Also, the use of a fluorescent ceramic composed mainly of a $Cr^{3+}$ activated garnet phosphor is advantageous in terms of higher output of near-infrared light components and device reliability.

In addition, since a wide variety of phosphors exist even for $Ce^{3+}$ activated garnet phosphors, it is also easy to procure these related technologies. Therefore, a desired light-emitting device can be efficiently developed by using $Cr^{3+}$ activated garnet phosphors with which horizontal deployment of the technologies fostered with $Ce^{3+}$ activated garnet phosphors can be carried out.

In this way, by using the second phosphor 2, the second wavelength-converted light 2B becomes a near-infrared light component having a maximum intensity value within a range of wavelengths of 700 nm or more and less than 2500 nm. For example, the second wavelength-converted light 2B becomes light having a maximum intensity value within a range of wavelengths of 750 nm or more and less than 1800 nm, and particularly 780 nm or more and less than 1500 nm.

(Operation of Light-Emitting Device)

Next, the operation of the light-emitting device 10 of the present embodiment will be described. First, when the solid-state light-emitting element 3 has power supplied thereto and is driven, the solid-state light-emitting element 3 emits the primary light 3B. When the primary light 3B radiated from the solid-state light-emitting element 3 is incident on the first wavelength converter 1A, the first wavelength converter 1A absorbs part of the primary light 3B and converts this into the first wavelength-converted light 1B having a lower light energy than the primary light 3B. In addition, when mixed light of the primary light 3B and the first wavelength-converted light 1B is incident on the second wavelength converter 2A, the second wavelength converter 2A absorbs part of the mixed light and converts this into the second wavelength-converted light 2B having a lower light energy than the mixed light.

The thus generated primary light 3B, first wavelength-converted light 1B, and second wavelength-converted light 2B become the third light component 7, first light component 5, and second light component 6, respectively, and are emitted as the output light 4.

Then, in the light-emitting device 10, the primary light 3B, the first wavelength-converted light 1B, and the second wavelength-converted light 2B are changed in color tone by changing the respective types of the solid-state light-emitting element 3, the first wavelength converter 1A, and the second wavelength converter 2A. Furthermore, the output ratios of the primary light 3B, the first wavelength-converted light 1B, and the second wavelength-converted light 2B can be adjusted by changing the thicknesses of the first wavelength converter 1A and the second wavelength converter 2A and the concentration of phosphors contained. Therefore, the spectral distribution of the output light 4 can be easily controlled.

(Improved Example of Light-Emitting Device)

Next, an improved example for an improvement in performance will be described in relation to the light-emitting device 10 of the present embodiment.

The light-emitting device 10 of the present embodiment can increase the absolute number of photons making up the output light 4 by means such as using a high output type of solid-state light-emitting element 3 or increasing the number of light-emitting elements. It is thereby possible for the light energy of light components of a wavelength of 700 nm or more in the output light 4 to exceed 3 W, preferably 10 W, and more preferably 30 W. By using this kind of high output type of light-emitting device, irradiation can be performed with an intense near-infrared ray, and therefore a comparatively intense near-infrared ray can be radiated even when the distance to the irradiated object is large. Furthermore, even if the irradiated object is very small or thick, information about the irradiated object can be obtained.

In the light-emitting device 10, the density of photons supplied to the phosphor can also be increased by means such as the solid-state light-emitting element 3 being a light-emitting element that emits high-density primary light, or by condensing the light emitted by the light-emitting element with an optical lens. Therefore, the light energy density of the primary light 3B radiated on the first wavelength converter 1A can be made to exceed 0.3 W/mm$^2$. In this way, the light-emitting device is capable of emitting output light 4 having a high light energy density. Therefore, the light-emitting device is capable of point output of near-infrared light having a high light energy density.

When a light-emitting element that emits high-density primary light is used as the solid-state light-emitting element 3, the light energy density of the primary light 3B can be made to exceed 0.3 W/mm$^2$, preferably 1.0 W/mm$^2$, and more preferably 3.0 W/mm$^2$. In this way, adopting a configuration in which optically diffused primary light is radiated on the first wavelength converter 1A results in a light-emitting device that emits comparatively intense output light 4. Furthermore, adopting a configuration in which primary light that is not optically diffused is radiated on the first wavelength converter 1A results in a light-emitting device that emits output light 4 having a high light energy density. It is therefore possible to provide a light-emitting device that can radiate near-infrared light over a large area, and a light-emitting device that radiates near-infrared light having a high light energy density, while using a light-emitting element having a small light output surface.

Note that in the light-emitting device 10, by selecting an appropriate solid-state light-emitting element, the intensity of light components in a region in which the wavelength is shorter than 440 nm in the output light 4 can be adjusted to be less than 3% of the maximum intensity value. Furthermore, the intensity of light components in a region in which the wavelength is shorter than 440 nm in the output light can also be adjusted to be less than 1% of the maximum fluorescence intensity. This results in output light having a near-zero intensity for light components in the ultraviolet to blue wavelength region, to which a photoresist is easily sensitive. This results in a light-emitting device that emits near-infrared light which is suitable for use in a yellow room and is advantageous for semiconductor-related inspection work.

The light-emitting device 10 may be further provided with a light distribution control mechanism that controls light distribution characteristics. Adopting such a configuration results in a light-emitting device that is capable of emitting output light having desired light distribution characteristics, as in a variable light distribution type of lighting system for in-vehicle use, for example.

The light-emitting device 10 may be further provided with a variable output intensity mechanism that changes the intensity of near-infrared rays, for example, such as an input power control device. Adopting such a configuration results in a light-emitting device that is advantageous for, for example, inspecting food products, drugs, and so forth, which are easily damaged by near-infrared irradiation.

The light-emitting device 10 may be provided with a control mechanism to control the output of the second wavelength-converted light 2B, particularly on-off control. In this way, the output ratio of near-infrared rays can be controlled, therefore resulting in a light-emitting device that is advantageous for adjusting the output intensity of near-infrared rays to correspond to customer requests.

The light-emitting device 10 can also be configured to alternately output the output light 4 including the second wavelength-converted light 2B and the output light 4 not including the second wavelength-converted light 2B. In this way, appearance according to the human eye and appearance according to a sensor of an electronic apparatus can be alternately confirmed by switching between the two. Therefore, interference between appearance according to the human eye and appearance according to a sensor of an electronic apparatus can be eliminated, resulting in a light-emitting device that is advantageous for making the appearance clear in either case.

The light-emitting device 10 may be provided with a variable mechanism that changes the peak wavelength of a light component having a maximum fluorescence intensity value within a wavelength range of 700 nm or more and less than 2500 nm. Adopting such a configuration results in a light-emitting device that is highly versatile and easily adaptable to miscellaneous uses. Furthermore, since the depth to which light penetrates into an object varies depending on the wavelength, the resulting light-emitting device is also advantageous for inspections in the depth direction of an object, and so forth.

Note that for this kind of mechanism for controlling near-infrared rays and mechanism for varying the fluorescence peak wavelength, it is possible to use an optical filter such as a bandpass filter or a low-cut filter. Then, a structure in which the output light 4 is passed through the optical filter and output or a structure in which the output light 4 is blocked by the optical filter may be adopted.

The light-emitting device 10 may be provided with a light control mechanism that controls the output of at least part of the output light 4, without being limited to the near-infrared light component. A configuration such as this results in a light-emitting device that is highly versatile and easily adaptable to miscellaneous uses.

In the light-emitting device 10, the output light 4 can also be pulsed light. The half width of the pulsed light irradiation time can be less than 300 ms. Furthermore, it is also possible for the half width to be made shorter as the output intensity of the output light 4 or the second light component 6 increases. Therefore, the half width can be made to be less than 100 ms, less than 30 ms, less than 10 ms, less than 3 ms, or less than 1 ms according to the output intensity of the output light 4 or the second light component 6. Note that the pulsed light non-irradiation time can be 1 ms or more and less than 10 s.

In this regard, it is reported that the human eye perceives light at 50 to 100 Hz (a period of 20 to 10 ms) as flicker. Furthermore, it is reported that birds such as pigeons perceive light at approximately 150 Hz (a period of 6.7 ms) as flicker, and insects such as flies perceive light at approximately 300 Hz (a period of 3.3 ms) as flicker. Therefore, one preferred form is a non-irradiation time of less than 30 ms with which these creatures will not perceive flicker.

On the other hand, intense light irradiation has the risk of damaging the illuminated object, and therefore for uses where it is not necessary to be concerned about flicker, a pulsed light non-irradiation time of 100 ms or longer, particularly 300 ms or longer, is a preferred form.

Note that when the purpose is beautification to adjust the growth of human hair and body hair, the light energy of output light is preferably 0.01 $J/cm^2$ or more and less than 1 $J/cm^2$. Therefore, when the light energy of output light emitted from the light-emitting device is in this range and the output light is radiated near the hair root area, the light can be absorbed by melanin and so forth present inside the skin, and as a result it is possible for the growth of hair and the like to be adjusted.

Here, a preferred 1/10 afterglow time of the output light 4, namely the time until the light intensity immediately before the light turns off decreases to 1/10, is preferably less than 100 μs, more preferably less than 10 μs, and particularly preferably less than 1 μs. Thus, the light-emitting device can be turned on instantaneously and turned off instantaneously.

Furthermore, the light-emitting device 10 can also be further provided with an ultraviolet light source that radiates ultraviolet rays having a maximum intensity value within a wavelength range of 120 nm or more and less than 380 nm, and preferably 250 nm or more and less than 370 nm. In this way, the light-emitting device also has a sterilizing effect or the like due to the ultraviolet rays.

The light-emitting device may be further provided with a conventionally known general lighting device. Doing so results in a lighting device provided with a function of outputting near-infrared light. Note that a lighting device obtained by combining a solid-state light-emitting element and a phosphor can be used. A specific example is a lighting device obtained by combining a blue LED and a $Ce^{3+}$ activated garnet phosphor serving as a green or yellow phosphor. Another example is a lighting device obtained by combining a blue LED, a $Ce^{3+}$ activated garnet phosphor serving as a green or yellow phosphor, and an $Eu^{2+}$ activated nitride phosphor or an $Eu^{2+}$ activated oxynitride phosphor serving as a red phosphor.

The light-emitting device of the present embodiment emitting a near-infrared light component can be a light source or lighting device for medical uses or biotechnological uses. In particular, the light-emitting device of the present embodiment can be a medical light-emitting device used for a fluorescence imaging method or photodynamic therapy, or a biotechnological light-emitting device used for the inspection and assay of cells, genes, and specimens. A near-infrared light component has the property of passing through living bodies and cells, and it is therefore possible for this kind of light-emitting device to be used for observing and treating affected areas from outside the body and for biotechnology.

Furthermore, the light-emitting device of the present embodiment can also be used as a light source for a sensing system or as a lighting system for a sensing system. In this way, for example, the contents or foreign substances in a bag or container made of an organic substance can be inspected in an unopened state using a near-infrared light component having the property of passing through organic substances and a near-infrared light component that is reflected by objects. Furthermore, with this kind of light-emitting device, it is possible to monitor animals, plants, and objects including people, for example.

In this way, the light-emitting device 10 of the present embodiment is a light-emitting device that is provided with the solid-state light-emitting element 3 and a phosphor, and emits the output light 4. The spectral distribution of the output light 4 has the first light component 5 and the second light component 6 derived from fluorescence emitted by the phosphor, and has the first minimum value 8 between the first light component 5 and the second light component 6. The first light component 5 is a fluorescent component having a maximum intensity value within a wavelength range of 560 nm or more and less than 700 nm. The second light component 6 is a fluorescent component having a maximum intensity value within a wavelength range of 700 nm or more and less than 2500 nm. The maximum intensity value of the second light component 6 is greater than the maximum intensity value of the first light component 5. The first minimum value 8 is less than 50% of the maximum intensity value of the second light component 6. According to a configuration such as this, the light-emitting device 10 becomes a device that is advantageous for increasing the output of visible light components and near-infrared light components of a specific wavelength.

The light-emitting device 10 of the present embodiment is a light-emitting device that is provided with the solid-state light-emitting element 3 and a phosphor, and emits the output light 4. The spectral distribution of the output light 4 has the first light component 5 and the second light component 6 derived from fluorescence emitted by the phosphor, and has the first minimum value 8 between the first light component 5 and the second light component 6. The first light component 5 is a fluorescent component having a maximum intensity value within a wavelength range of 380 nm or more and less than 700 nm. The second light component 6 is a fluorescent component having a maximum intensity value within a wavelength range of 700 nm or more and less than 2500 nm. The spectral distribution of the second light component 6 does not change by more than +8%/nm in the wavelength range of 700 nm or more. The maximum intensity value of the second light component 6 is greater than the maximum intensity value of the first light component 5. The first minimum value 8 is less than 50% of the maximum intensity value of the second light component 6.

Furthermore, the light-emitting device 10 of the present embodiment is a light-emitting device that is provided with the solid-state light-emitting element 3 and the first phosphor 1 and second phosphor 2, and that emits the output light 4. The spectral distribution of the output light 4 has the first light component 5 derived from fluorescence emitted by the first phosphor 1 and the second light component 6 derived from fluorescence emitted by the second phosphor 2, and has the first minimum value 8 between the first light component 5 and the second light component 6. The first light component 5 is a fluorescent component having a maximum intensity value within a wavelength range of 380 nm or more and less than 700 nm. The second light component 6 is a fluorescent component having a maximum intensity value within a wavelength range of 700 nm or more and less than 2500 nm. The maximum intensity value of the second light component 6 is greater than the maximum intensity value of the first light component 5. The first minimum value 8 is less than 50% of the maximum intensity value of the second light component 6.

[Electronic Apparatus]

Figure 6:
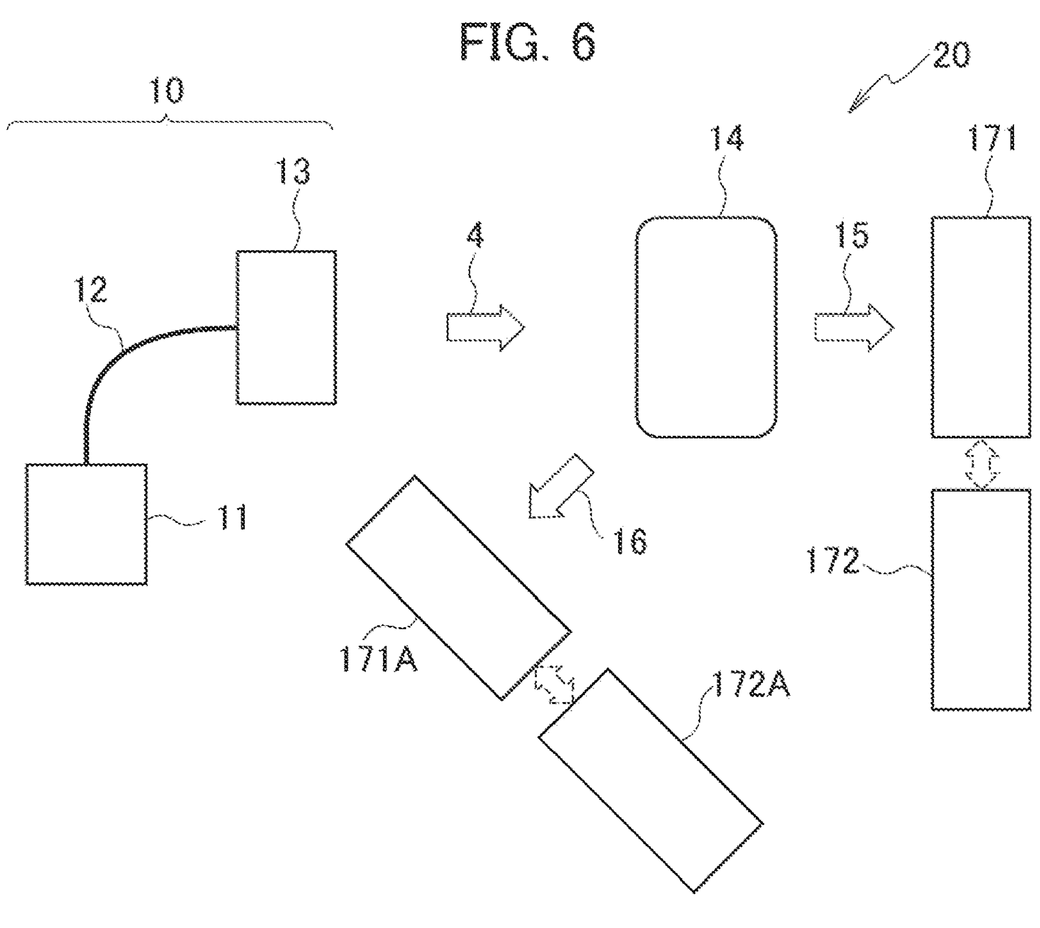
FIG. 6 is a schematic view illustrating an example of the configuration of an electronic apparatus according to an embodiment herein.

Next, an electronic apparatus according to the present embodiment will be described. An electronic apparatus according to the present embodiment is provided with the aforementioned light-emitting device 10. FIG. 6 schematically illustrates an example of an electronic apparatus according to the present embodiment.

In an electronic apparatus 20, the light-emitting device 10 is provided with at least a power source circuit 11, a conductor 12, and a light-emitting part 13. The power source circuit 11 supplies electrical energy to the light-emitting part 13 through the conductor 12.

The light-emitting part 13 is provided with the aforementioned solid-state light-emitting element 3 and phosphor (first phosphor 1 and second phosphor 2). Also, the light-emitting part 13 converts electrical energy into light energy. That is, the light-emitting part 13 converts at least part of the electrical energy supplied from the power source circuit 11 into light energy that becomes the output light 4 and outputs the light energy.

The electronic apparatus 20 is further provided with a first detector 171, a second detector 172, a third detector 171A, and a fourth detector 172A. The first detector 171 and the third detector 171A detect a near-infrared light component used for a main purpose. The second detector 172 and the fourth detector 172A detect a visible light component used for an auxiliary purpose.

Specifically, the first detector 171 detects a near-infrared transmitted light component 15 in the output light 4 radiated from the light-emitting part 13 onto an irradiated object 14. The second detector 172 detects a visible transmitted light component 15 in the output light 4 radiated onto the irradiated object 14. The third detector 171A detects a near-infrared reflected light component 16 in the output light 4 radiated onto the irradiated object 14. The fourth detector 172A detects a visible reflected light component 16 in the output light 4 radiated onto the irradiated object 14.

With this configuration, either of the transmitted light component 15 transmitted through the irradiated object 14 and the reflected light component 16 reflected by the irradiated object 14 can be detected by any combination of the following (1) to (4). Therefore, information regarding the irradiated object 14 involving near-infrared and visible light components can be detected by means of a composite view.

(1) Combination of the first detector 171 and the second detector 172

(2) Combination of the first detector 171 and the fourth detector 172A (3) Combination of the third detector 171A and the second detector 172

(4) Combination of the third detector 171A and the fourth detector 172A

In this way, the electronic apparatus of the present embodiment is provided with the light-emitting device 10, which emits the output light 4 including visible light and near-infrared light, detectors for visible light, and detectors for near-infrared light. Therefore, the electronic apparatus becomes a detection device having higher precision and higher sensitivity, and also reduced size and higher efficiency.

The light-emitting device 10 can be configured such that the energy of the output light 4 is high and a wide range is illuminated. Therefore, even if the output light 4 is radiated on the irradiated object 14 from a distance away, a signal having a good S/N ratio (signal/noise ratio) can be detected. Therefore, an electronic apparatus is obtained that is suitable for the inspection of a large irradiated object 14, the batch inspection of objects distributed over a wide area, the detection of objects present in part of an inspection area covering a wide area, the detection of people and objects from a distance, and so forth.

For reference, the size of the light-emitting device of the present embodiment will be described. The area of the main light extraction surface of the light-emitting part 13 can be 1 $cm^2$ or more and less than 1 $m^2$, and preferably 10 $cm^2$ or more and less than 1000 $cm^2$. Furthermore, the minimum distance from the light-emitting part 13 to the irradiated object 14 can be 1 mm or more and less than 10 m. In the case where it is necessary for the irradiated object 14 to be irradiated with an intense near-infrared ray, for example, in cases of medical, cosmetic, and delicate foreign substance inspections, the minimum distance from the light-emitting part 13 to the irradiated object 14 can be 1 mm or more and less than 30 cm, and preferably 3 mm or more and less than 10 cm. In addition, in the case where it is necessary to inspect an irradiated object 14 having a wide range, the minimum distance from the light-emitting part 13 to the irradiated object 14 can be 30 cm or more and less than 10 m, and preferably 1 m or more and less than 5 m.

Note that in the case where it is necessary to radiate an intense near-infrared ray over a wide range, it is preferable that the light-emitting part 13 be configured to be movable, and it is more preferable that it be configured to be able to move freely according to the form of the irradiated object. For example, the light-emitting part 13 can have a structure that enables coming and going on a straight or curved line, a structure that enables scanning in XY axial directions or XYZ axial directions, or a structure attached to a mobile body (automobile, bicycle, or flying body such as a drone).

Here, various photodetectors can be used for the first detector 171, the second detector 172, the third detector 171A, and the fourth detector 172A. Specifically, depending on the form of use of the electronic apparatus, it is possible to use a quantum-type photodetector (photodiode, phototransistor, photo IC, CCD image sensor, CMOS image sensor, or the like) that detects the charge generated when light is input to a PN junction of a semiconductor. Furthermore, as a photodetector, it is also possible to use a thermal-type photodetector (a thermopile using a thermoelectric effect, or a pyroelectric element using a pyroelectric effect) that detects changes in electrical properties caused by a temperature increase due to heat generated when light is received, or an infrared film that is sensitive to light.

As the first detector 171, the second detector 172, the third detector 171A, and the fourth detector 172A, a single element using a stand-alone photoelectric conversion element may be used, or an imaging element having an integrated photoelectric conversion element may be used. The imaging element may have a linear form disposed in one dimension, or may have a planar form disposed in two dimensions. Furthermore, an imaging camera can also be used as these detectors.

The electronic apparatus of the present embodiment is preferably an inspection device, detection device, monitoring device, or a sorting device for irradiated objects, which uses the output light 4 including near-infrared light. The near-infrared light component of the output light 4 has the property of passing through most substances. Therefore, by adopting a configuration in which near-infrared light is radiated from outside of an irradiated object and the transmitted light or reflected light is detected, the internal state, the presence or absence of foreign substances, and so forth can be inspected without destroying the irradiated object.

Furthermore, near-infrared light components are invisible to the human eye, and the reflection characteristics thereof are dependent on the substance. Therefore, by adopting a configuration in which an irradiated object is irradiated with near-infrared light and the reflected light is detected, it is possible to detect the irradiated object even in the dark and so forth without being perceived by humans.

The electronic apparatus can inspect the internal states of irradiated objects, the presence or absence of foreign substances, and so forth to determine the quality of the irradiated objects and select good-quality items and poor-quality items, without destroying the irradiated objects. It therefore becomes possible for the electronic apparatus to sort irradiated objects by further being provided with a mechanism to sort irradiated objects of a normal state and irradiated objects of an abnormal state.

In the electronic apparatus, it is possible for the light-emitting device to be fixed rather than being made movable. In this way, it is not necessary to provide a complicated mechanism for mechanically moving the light-emitting device, therefore resulting in an electronic apparatus that is unlikely to malfunction. Furthermore, by fixing the light-emitting device indoors or outdoors, it is possible to observe the state of people and objects in a predetermined location from a fixed point, and to count the number of people and objects. This results in an electronic apparatus that is advantageous for collecting big data that is useful for discovering problems, for business applications, and so forth. Note that possible examples of a fixed electronic apparatus provided with a light-emitting device include store lighting, indoor lighting, street lights, and surgical lighting devices.

The electronic apparatus can also be used to make the light-emitting device movable and change the location of irradiation. For example, the light-emitting device can be made movable by attachment to a mobile stage or a mobile body (vehicle, flying body, or the like). In this way, the light-emitting device can illuminate a desired location or a wide range, therefore resulting in an electronic apparatus that is advantageous for inspecting large objects and inspecting the state of objects outdoors. Note that a possible example of a movable electronic apparatus provided with a light-emitting device is a drone.

The electronic apparatus can have a configuration further provided with a hyperspectral camera as an imaging camera, in addition to the light-emitting device. The electronic apparatus is thereby able to perform hyperspectral imaging. An electronic apparatus provided with a hyperspectral camera can distinguish, as images, differences that cannot be determined by the naked eye or an ordinary camera, therefore resulting in an inspection device that is useful in a wide range of fields related to the inspection, selection, and so forth of products.

Figure 7:
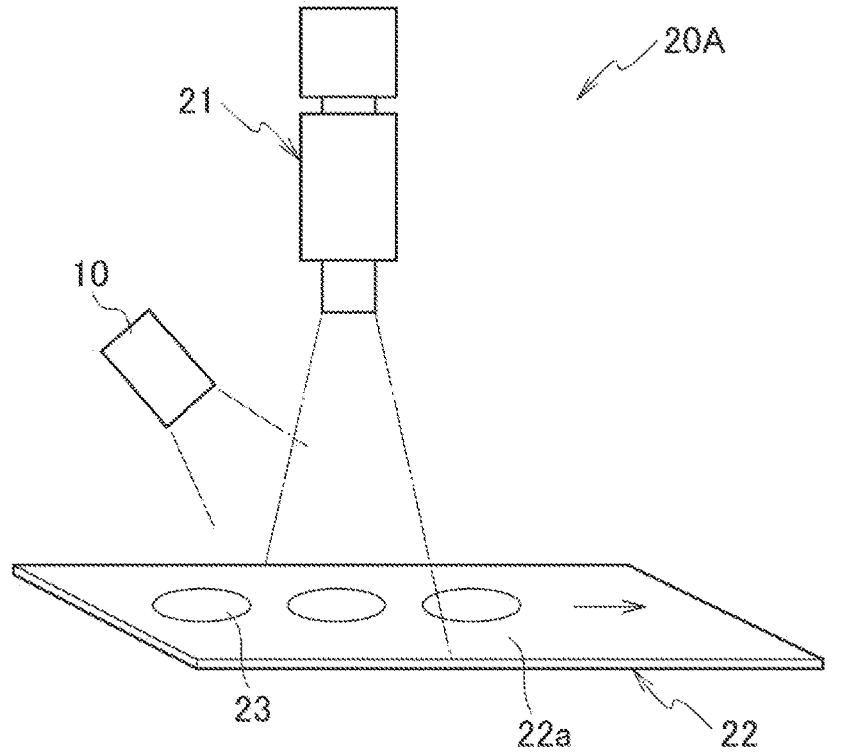
FIG. 7 is a schematic view illustrating another example of the configuration of the electronic apparatus according to an embodiment herein.

Specifically, as illustrated in FIG. 7, an electronic apparatus 20A is provided with the light-emitting device 10 and a hyperspectral camera 21. Irradiated objects 23 that are placed on a surface 22*a* of a conveyor 22 are then captured by the hyperspectral camera 21 while output light is radiated from the light-emitting device 10 on the irradiated objects 23. By analyzing the obtained images of the irradiated objects 23, the irradiated objects 23 can be inspected and selected.

It is also preferable that the electronic apparatus be further provided with a data processing system that performs machine learning, in addition to the light-emitting device. It thereby becomes possible to iteratively learn data imported into a computer and to discover patterns hidden therein. Furthermore, it also becomes possible to adapt newly captured data to those patterns. Therefore, the resulting electronic apparatus is advantageous for implementing automation and achieving higher accuracy in inspection, detection, monitoring, and the like, and also for future prediction using big data.

The electronic apparatus can be used for medical uses, veterinary uses, biotechnology uses, agriculture, forestry, and fishery industry uses, livestock industry uses (meat, meat products, dairy products, and the like), and manufacturing industry uses (foreign substance inspection, content quantity inspection, shape inspection, packaging state inspection, and the like). Furthermore, the electronic apparatus can also be used for inspection of pharmaceutical products, animal testing, food products, beverages, agriculture, forestry, and fishery products, livestock products, and industrial products. In other words, the electronic apparatus of the present embodiment can be used on any of the human body, animals and plants, and objects, and in addition can also be used on any of gases, liquids, and solids.

The electronic apparatus can be used as any of a medical device, a treatment device, a beauty device, a health device, a care-related device, an assay device, a measurement device, and an evaluation device.

For example, for medical and biotechnology development purposes, the electronic apparatus of the present embodiment can be used for inspection, detection, measurement, evaluation, assay, analysis, observation, monitoring, separation, diagnosis, treatment, purification, and so forth for the following: 1) blood, body fluids, and their components; 2) excretions (urine and feces); 3) proteins and amino acids; 4) cells (cancer cells); 5) genes, chromosomes, and nucleic acids; 6) biological samples, bacteria, specimens, and antibodies; 7) biological tissue, organs, and blood vessels; and 8) skin diseases and alopecia.

Furthermore, for example, for beauty and health care purposes, the electronic apparatus of the present embodiment can be used for inspection, detection, measurement, evaluation, assay, analysis, observation, monitoring, beautification, sanitation, growth promotion, health promotion, diagnosis, and so forth for the following: 1) skin; 2) hair and body hair; 3) oral, endodontic, and periodontal conditions; 4) ears and nose; and 5) vital signs.

For example, for purposes of the agriculture, forestry, and fishery industry, the livestock industry, and the manufacturing industry, the electronic apparatus of the present embodiment can be used for inspection, detection, measurement, quantification, evaluation, assay, analysis, observation, monitoring, recognition, selection, sorting, and so forth for the following: 1) industrial products (electronic members and electronic devices); 2) agricultural products (such as fruits and vegetables); 3) enzymes and bacteria; 4) marine products (fish, shellfish, crustaceans, and mollusks); 5) pharmaceutical products and biological samples; 6) food products and beverages; 7) the presence and state of people, animals, and objects; 8) the state of gases (water vapor); 9) liquids, fluids, water, moisture, and humidity; 10) the shape, color, internal structure, and physical state of objects; 11)

space, position, and distance; 12) the contamination state of objects; 13) the state of molecules and particles; and 14) industrial waste.

For example, for caregiving purposes, the electronic apparatus can be used to confirm excretion and for the identification, management, monitoring, and so forth of health conditions.

In this way, the electronic apparatus of the present embodiment can be used for all kinds of uses such as inspection, detection, measurement, quantification, evaluation, assay, analysis, observation, monitoring, recognition, selection, and sorting.

Note that the present embodiment can also be regarded as a simple method invention of any of an inspection method, detection method, monitoring method, sorting method, assay method, measurement method, and evaluation method using the light-emitting device 10.

EXAMPLES

The light-emitting device of the present embodiment will be described in additional detail below by means of examples; however, the present embodiment is not limited to these examples.

Example 1

To begin, a first wavelength-conversion light-emitting element was fabricated. The first wavelength-conversion light-emitting element was configured of a solid-state light-emitting element 3 which emits primary light 3B that is blue light (peak wavelength: 400 to 455 nm), and a first wavelength converter 1A.

The solid-state light-emitting element 3 used was a blue LED chip, and the blue LED chip used was of the product number LE B P2MQ manufactured by OSRAM Opto Semiconductors. Furthermore, the first wavelength converter 1A was a resin fluorescent film containing a $Y_3Al_2(AlO_4)_3:Ce^{3+}$ phosphor (YAG phosphor) and a $(Sr,Ca)AlSiN_3:Eu^{2+}$ phosphor (SCASN phosphor). The first wavelength converter 1A and the first wavelength-conversion light-emitting element were then fabricated as follows.

First, the YAG phosphor and the SCASN phosphor were prepared as phosphor powders. The YAG phosphor used was manufactured by Tokyo Kagaku Kenkyusho Co., Ltd. and had a central particle size $D_{50}$ of approximately 24 μm. This YAG phosphor had a fluorescence peak at a wavelength of around 540 nm and emitted yellow-green light. The SCASN phosphor used was manufactured by Mitsubishi Chemical Corporation and had a central particle size $D_{50}$ of approximately 14 μm. This SCASN phosphor had a fluorescence peak at a wavelength of around 625 nm and emitted red light. In addition, a two-liquid mixing type of thermosetting silicone resin (manufactured by Shin-Etsu Chemical Co., Ltd., product name: KER-2500 A/B) was prepared as a sealing agent for the phosphor powders.

Next, the YAG phosphor (2.352 g) and the SCASN phosphor (0.504 g) were mixed with the silicone resin (agent A at 0.75 g, agent B at 0.75 g) using a stirring defoaming device and then further defoamed. The stirring defoaming device used at this time was manufactured by Shinki Corporation, the product name was Awatori Rentaro (registered trademark), and the model was ARE-310. Furthermore, the rotational speed of the stirring defoaming device was approximately 2000 rpm, and processing was carried out for 3 minutes. In this way, a phosphor paste composed of the YAG phosphor, SCASN phosphor, and silicone resin was fabricated.

The phosphor paste thus obtained was dropped using a dispenser (model: ML-5000 XII, manufactured by Musashi Engineering, Inc.) into a frame having a height of approximately 210 μm provided around the blue LED chip. The phosphor paste was then cured by heating in air at 150° C. for 2 hours. In this way, a resin fluorescent film having a thickness of approximately 200 μm was formed on the main light extraction surface of the blue LED, thereby obtaining the first wavelength converter 1A (5 mm long, 5 mm wide, and approximately 200 μm thick) and the first wavelength-conversion light-emitting element.

Next, a second wavelength-conversion light-emitting element configured of the solid-state light-emitting element 3 and the second wavelength converter 2A was fabricated. Similar to the first wavelength-conversion light-emitting element, the solid-state light-emitting element 3 used was a blue LED chip. The second wavelength converter 2A was a resin fluorescent film containing a phosphor having a fluorescence peak at around 750 nm and composed mainly of a composite metal oxide activated with $Cr^{3+}$. Note that this phosphor is a $(Gd,La)_3Ga_2(GaO_4)_3:Cr^{3+}$ phosphor (GLGG phosphor) expressed by the composition formula of $(Gd_{0.95}La_{0.05})_3(Ga_{0.97}Cr_{0.03})_2(GaO_4)_3$, and has a garnet-type crystal structure.

The GLGG phosphor was prepared by means of an orthodox solid phase reaction using the following compound powders as the main raw materials.

- Gadolinium oxide ($Gd_2O_3$): purity 3N, manufactured by Nippon Yttrium Co., Ltd.
- Lanthanum hydroxide ($La(OH)_3$) hydroxide: purity 3N, manufactured by Shin-Etsu Chemical Co., Ltd.
- Gallium oxide ($Ga_2O_3$): purity 4N, manufactured by Nippon Rare Metal, Inc.
- Chromium oxide ($Cr_2O_3$): purity 3N, manufactured by Kojundo Chemical Laboratory Co., Ltd.

Specifically, first, the above raw materials were weighed to produce a compound of a stoichiometric composition $(Gd_{0.95}La_{0.05})_3(Ga_{0.97}Cr_{0.03})_2(GaO_4)_3)$ by means of a chemical reaction. The weighed values of the raw materials are shown in Table 1.

TABLE 1

| | Raw material (g) | | | |
|---|---|---|---|---|
| General formula | $Gd_2O_3$ | $La(OH)_3$ | $Ga_2O_3$ | $Cr_2O_3$ |
| $(Gd_{0.95}La_{0.05})_3(Ga_{0.97}Cr_{0.03})_2Ga_3O_{12}$ | 10.213 | 0.563 | 9.154 | 0.090 |

Next, 20 g of the weighed raw materials was added to an alumina pot mill (capacity 250 ml) together with alumina balls (diameter φ 3 mm, total 200 g) and 60 ml of ethanol. The raw materials were then wet-mixed by rotating the pot mill at a rotation speed of 150 rpm for 30 minutes, using a planetary ball mill (manufactured by Fritsch Co., Ltd., product number P-5).

Next, the alumina balls were removed using a sieve, and a slurry-like mixed raw material composed of the raw materials and ethanol was obtained. Thereafter, the mixed raw material was dried at 125° C. using a dryer. The dried mixed raw material was then lightly mixed using a mortar and pestle to thereby make a phosphor raw material.

Next, the phosphor raw material was placed in an alumina firing vessel (material SSA-H, size B3, with lid) and fired for 2 hours in air at 1500° C. using a box-type electric furnace. Note that the temperature increase/decrease rate during firing was set at 300° C./h.

The obtained fired product was disintegrated by hand using an alumina mortar and pestle, and then passed through a nylon mesh (95 μm mesh openings) to remove coarse particles, thereby obtaining a GLGG phosphor in powder form.

Although the data is omitted, the crystal composition of the obtained GLGG phosphor was evaluated using an X-ray diffraction device (desktop X-ray diffraction device, MiniFlex, manufactured by Rigaku Corporation), and it was mostly a garnet compound of a single crystal phase. In addition, the particle shape and particle size of the GLGG phosphor were evaluated using an electron microscope (desktop microscope Miniscope (registered trademark) TM4000, manufactured by Hitachi High-Technologies Corporation). As a result, the particle shape of the GLGG phosphor was a monodisperse particle shape, the particle shape was a shape that can be regarded as being derived from garnet crystals, and the main particle size was approximately 15 μm.

Then, the fluorescence characteristics of the GLGG phosphor were evaluated under irradiation with blue light of a wavelength of 450 nm using an absolute PL quantum yield spectrometer (C9920-02, manufactured by Hamamatsu Photonics K.K.). As a result, the fluorescence peak wavelength was 747 nm, the internal quantum efficiency (IQE) was 92%, and the light absorption rate (Abs.) of blue light was 57%. Furthermore, as a result of evaluating under irradiation with red light of a wavelength of 628 nm, the fluorescence peak wavelength was 746 nm, the internal quantum efficiency (IQE) was 93%, and the light absorption rate (Abs.) of red light was 45%.

Using the GLGG phosphor (4.57 g) fabricated in this way, the second wavelength converter 2A (5 mm long, 5 mm wide, and 310 μm thick) and the second wavelength-conversion light-emitting element were fabricated by the same procedure as for the first wavelength converter 1A.

Then, using the first wavelength-conversion light-emitting element configured of a blue LED and the first wavelength converter 1A, and the second wavelength-conversion light-emitting element configured of a blue LED and the second wavelength converter 2A, a light-emitting device such as that illustrated in FIG. 5 was fabricated, which was the light-emitting device of this example.

The light emission characteristics of the obtained light-emitting device were evaluated. First, when a current of 500 mA was applied to the blue LED chip of the first wavelength-conversion light-emitting element, blue light as the primary light 3B was radiated from the blue LED chip. In addition, part thereof was converted by the first wavelength converter 1A into visible light (orange light produced by additive color mixing of a weak green light component and an intense red light component) as the first wavelength-converted light 1B. Then, first mixed light composed of blue light as the primary light 3B and visible light as the first wavelength-converted light 1B was emitted from the first wavelength-conversion light-emitting element. Note that sometimes the output ratio of the blue light component was small, and the appearance of the mixed light was that of substantially orange light and was light of a color tone that could not be considered to be white light.

Next, when a current of 2000 mA was applied to the blue LED chip of the second wavelength-conversion light-emitting element, blue light as the primary light 3B was radiated from the blue LED chip. Then, part thereof was converted by the second wavelength converter 2A into near-infrared light as the second wavelength-converted light 2B. Then, second mixed light (violet light) composed of blue light as the primary light 3B and near-infrared light as the second wavelength-converted light 2B was emitted from the second wavelength-conversion light-emitting element.

Then, due to the first mixed light and the second mixed light further mixing, mixed light composed of the primary light 3B, the first wavelength-converted light 1B, and the second wavelength-converted light 2B was emitted as the output light 4. Note that the spectral distribution illustrated in FIG. 1 is the spectral distribution of the output light 4 emitted from the light-emitting device of this example.

As can be seen from FIG. 1, the spectral distribution of the output light 4 is composed of the first light component 5 derived from the first wavelength-converted light 1B, the second light component 6 derived from the second wavelength-converted light 2B, and the third light component 7 derived from the primary light 3B. Also, the spectral distribution has peaks in the blue wavelength range of 440 nm or more and less than 470 nm, the red wavelength range of 600 nm or more and less than 650 nm, and the dark red to near-infrared wavelength range of 700 nm or more and less than 800 nm. Therefore, the output light 4 had a multimodal (trimodal) broad spectral distribution having light components over a wide wavelength range of at least 410 nm to 950 nm.

Also, the spectral distribution of the output light 4 has the first minimum value 8 between the first light component 5 and the second light component 6, and the maximum intensity value of the second light component 6 is greater the maximum intensity value of the first light component 5. In addition, the first minimum value 8 was less than 50% of the maximum intensity value of the second light component 6, and specifically was 37% (less than 40%).

Note that the first light component 5 had a fluorescence peak at a wavelength of 618 nm, and the 60% width of the spectral distribution was 80 nm (70 nm or more and less than 90 nm). Note that this "60% width" is the wavelength difference between wavelengths (short-wavelength side and long-wavelength side) where the fluorescence peak intensity has an intensity that is 60%. Furthermore, the second light component 6 had a fluorescence peak at 747 nm, and the 50% width of the spectral distribution was 118 nm (110 nm or more and less than 125 nm). Note that this "50% width" is the wavelength difference between wavelengths (short-wavelength side and long-wavelength side) where the fluorescence peak intensity has an intensity that is 50%. Also, the third light component 7 had a fluorescence peak at 455 nm, and the half width was 27 nm (25 nm or more and less than 30 nm).

Furthermore, the third light component 7 of a wavelength of 400 nm or more and less than 500 nm, the first light component 5 of a wavelength of 510 nm or more and less than 670 nm, and the second light component 6 of a wavelength of 680 nm or more and less than 1050 nm were all unimodal.

Then, in the output light 4, the correlated color temperature was 2299 K, the duv indicating deviation from black-body radiation was −97.0, the xy chromaticity coordinate was (x, y)=(0.358, 0.208), and the average color rendering index Ra was 37. Note that the reason for the low average color rendering index (Ra) can be considered to be that the maximum value of the spectral intensity in the green wavelength range of 500 nm or more and less than 550 nm was low at less than 15% (11%) of the maximum intensity value of the second light component.

Examples 2 to 4

The light-emitting devices of Examples 2 to 4 were light-emitting devices having the structure illustrated in FIG. 2. Then, for simplicity, a white LED for LED lighting obtained by combining a blue LED (fluorescence peak wavelength: 450 to 455 nm) and a phosphor was used, and the white LED and the second wavelength converter 2A were combined to obtain the light-emitting devices of these examples.

Note that the phosphor used in the white LED can be assumed to be a mixed phosphor of $Ce^{3+}$ activated garnet green phosphor and an $Eu^{2+}$ activated nitride red phosphor from the spectral distribution of the light emitted by the white LED.

First, three types of white LEDs (white LEDs 1 to 3, manufactured by Lumileds Holding B. V) were prepared, and these are as shown in Table 2. Next, the second wavelength converter 2A was mounted on the light output surface of the white LEDs 1 to 3, after which the white LEDs were turned on by supplying a rated current thereto. The output light was then integrated with an integrating sphere (p 20 inches, product number: LMS-200, manufactured by Labsphere), and the spectral distribution, radiant flux, and the like of the output light 4 were measured using a total luminous flux measurement system (product number: SLMS-CDS-2021, manufactured by Labsphere).

TABLE 2

| | White LED 1 | White LED 2 | White LED 3 |
|---|---|---|---|
| Radiant flux (W) | 6.17 | 8.98 | 4.98 |
| Luminous flux (lm) | 1970 | 2444 | 1622 |
| Chromaticity coordinate x | 0.35 | 0.43 | 0.44 |
| Chromaticity coordinate y | 0.36 | 0.39 | 0.40 |
| Correlated color temperature (K) | 4777 | 3023 | 2970 |
| duv | −0.5 | −4 | −2.4 |
| Ra | 83 | 96 | 82 |
| Rated current (mA) | 269 | 400 | 180 |

Note that a resin fluorescent film (thickness: 340 μm) prepared using a GLGG phosphor was used for the second wavelength converter 2A. The second wavelength converter 2A was prepared as follows.

First, the aforementioned GLGG phosphor (4.57 g) was prepared as a phosphor powder. Furthermore, the aforementioned two-liquid mixing type of thermosetting silicone resin (agent A at 0.75 g, agent B at 0.75 g) was prepared as a sealing agent for the phosphor powder. These were then mixed and subjected to defoaming treatment in the same manner as in Example 1, and a phosphor paste composed of GLGG phosphor and silicone resin was prepared.

The phosphor paste thus obtained was dropped using a dispenser into a mold provided on a glass substrate (200 mm long, 200 mm wide, and 1 mm thick). Thereafter, a squeegee was used to flatten the surface of the dropped phosphor paste. A phosphor sheet was prepared by removing the mold and performing heating and curing in air for 2 hours at 150° C. The second wavelength converter 2A (50 mm long, 60 mm wide, and 340 μm thick) was then obtained by peeling the phosphor sheet from the glass substrate using tweezers.

Figure 8:
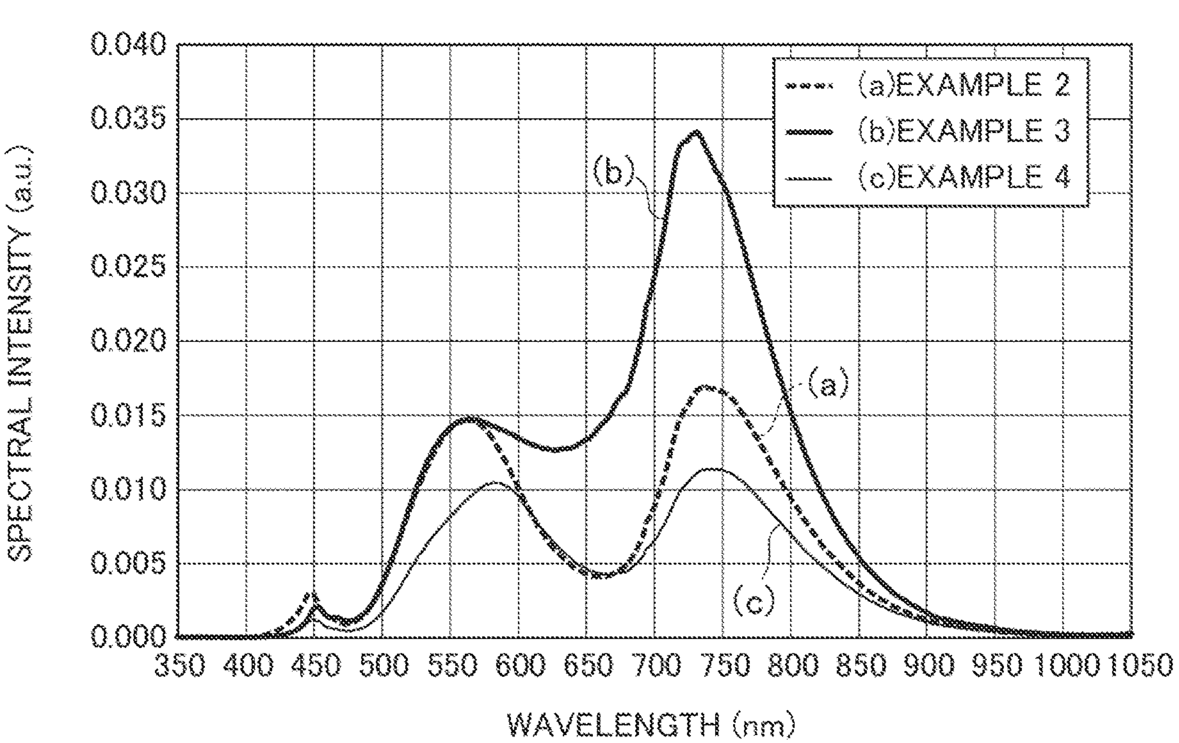
FIG. 8 is a graph illustrating the spectral distribution of output light emitted by light-emitting devices of Examples 2 to 4.

FIG. 8 collectively illustrates the spectral distributions of the output light of the light-emitting devices of Examples 2 to 4. As can be seen from FIG. 8, the spectral distributions of the output light of Examples 2 to 4 have light components within the entire wavelength range of at least 420 nm or more and less than 950 nm. Furthermore, the output light is formed mainly of a light component (third light component) having a peak at around a wavelength of 450 nm, a fluorescent component (first light component) having a maximum intensity value at a wavelength of 560 to 600 nm, and a fluorescent component (second light component) having a maximum intensity value at a wavelength 730 to 750 nm. Here, the third light component is a light component derived from a blue LED. Furthermore, the first light component is a light component derived from a mixed phosphor of a green phosphor ($Ce^{3+}$ activated garnet phosphor) and a red phosphor ($Eu^{2+}$ activated nitride-based phosphor). The second light component is a fluorescent component derived from a near-infrared phosphor ($Cr^{3+}$ activated garnet phosphor).

In all spectral distributions, there is a first minimum value between the first light component and the second light component, and the maximum intensity value of the second light component is greater than the maximum intensity value of the first light component. In addition, the first minimum value was less than 50% of the maximum intensity value of the second light component, and specifically was 24.4% (Example 2), 37.1% (Example 3), and 37.3% (Example 4). Furthermore, the maximum intensity value of the third light component was small and was less than 20% of the maximum intensity value of the second light component, and specifically was 18.1% (Example 2), 6.2% (Example 3), and 10.7% (Example 4).

From the above, these examples can be said to be light-emitting devices that are advantageous for applications requiring output light that includes a green to yellow light component and an intense near-infrared light component.

Note that, although the data has been omitted for convenience of the description, when the white light emitted by the white LED was made to pass through the second wavelength converter 2A, the intensity of the blue light component and the red light component in the light components emitted by the white LED tended to decrease significantly. This is thought to be because the $Cr^{3+}$ activated phosphor included in the second wavelength converter 2A has the property of absorbing blue and red light components, and due to this, the output light tends to take on a yellow tinge. Therefore, in order to obtain output light that is close to white light, it is preferable to adopt a structure in which part of the light of a white LED (wavelength-conversion light-emitting element) passes through as it is without passing through the second wavelength converter 2A.

Table 3 collectively shows the characteristics of the output light of Examples 2 to 4. The output light of Examples 2 to 4 had a correlated color temperature of 2500 K or more and less than 4500 K, and a duv of +10 or more and less than +50 (20 or more and less than 40). Furthermore, the average color rendering index (Ra) was 50 or more and less than 80.

TABLE 3

| | Example 2 | Example 3 | Example 4 |
|---|---|---|---|
| Radiant flux (W) | 3.76 | 6.26 | 2.74 |
| Luminous flux (lm) | 770 | 874 | 530 |
| Chromaticity coordinate x | 0.41 | 0.46 | 0.47 |
| Chromaticity coordinate y | 0.50 | 0.48 | 0.48 |
| Correlated color temperature (K) | 4025 | 3138 | 3127 |
| duv | 39.9 | 24.2 | 24.2 |
| Ra | 57 | 75 | 63 |
| Rated current (mA) | 269 | 400 | 180 |

Here, in the light-emitting device of Example 3, the correlated color temperature hardly changed even after the white light emitted by the white LED was made to pass through the second wavelength converter 2A. Furthermore, the average color rendering index (Ra) was 75, indicating a comparatively high color rendering property, and it was evident that a comparatively high radiant flux was maintained.

From this data, Examples 2 to 4 can also be said to be light-emitting devices that are advantageous for obtaining output light that emits both high-output near-infrared rays and visible light.

Examples 5 to 8

Similar to Examples 2 to 4, the light-emitting devices of Examples 5 to 8 were also light-emitting devices having the structure illustrated in FIG. 2. However, a commercially available blue LED (fluorescence peak wavelength: 460 nm, product number: PT-121-B-L11-EPG, manufactured by Luminus Devices, Inc.) was used as the blue LED. The phosphors used were a $Ce^{3+}$ activated garnet phosphor (LuCaMG phosphor), which is represented by the general formula of $Lu_2CaMg_2(SiO_4)_3:Ce^{3+}$ and emits orange light, and the aforementioned GLGG phosphor. Note that the LuCaMG phosphor was prepared in accordance an example in International Publication No. WO 2018/230207. A LuCaMG phosphor is a group of phosphor particles having a primary particle size of approximately 3 to 15 μm, which absorb blue light and convert this into orange light (fluorescence peak wavelength: approximately 596 nm).

Then, a first phosphor sheet that is a resin fluorescent film containing the LuCaMG phosphor, and a second phosphor sheet that is a resin fluorescent film containing the GLGG phosphor were prepared in the same manner as in Examples 2 to 4. Specifically, the first phosphor sheet and the second phosphor sheet were prepared by kneading the thermosetting silicone resin and the phosphor such that the filling ratio of the phosphor in the resin was 30 vol %, and causing them to undergo thermosetting. At this time, the thickness of the first phosphor sheet was set to 97 μm, and the thickness of the second phosphor sheet was set to three types of 100 μm, 193 μm, and 270 μm. Note that the thickness of the phosphor sheets was adjusted by using molds having different thicknesses.

Next, the first phosphor sheet was used as the first wavelength converter 1A and the second phosphor sheet was used as the second wavelength converter 2A to fabricate the four types of light-emitting devices shown in Table 4. Note that the first wavelength converter 1A and the second wavelength converter 2A form a two-layer structure, and therefore the wavelength converter that is different from the "wavelength converter radiating output light 4" in Table 4 is the wavelength converter on the side where the primary light 3B is incident, that is, on the blue LED side.

TABLE 4

| | First wavelength converter 1A (containing LuCaMg) | Second wavelength converter 2A (containing GLGG) | Wavelength converter radiating output light 4 |
|---|---|---|---|
| Example 5 | 97 μm | 100 μm | First wavelength converter |
| Example 6 | 97 μm | 193 μm | First wavelength converter |
| Example 7 | 97 μm | 270 μm | First wavelength converter |
| Example 8 | 97 μm | 270 μm | Second wavelength converter |

Then, as illustrated in FIG. 2, the wavelength converters forming the two-layer structure were placed on the light output surface of the blue LED, and the blue LED was turned on by supplying a current of 300 mA thereto. Thereafter, the spectral distribution, radiant flux, and so forth of the output light were measured as in Examples 1 to 4.

Figure 9:
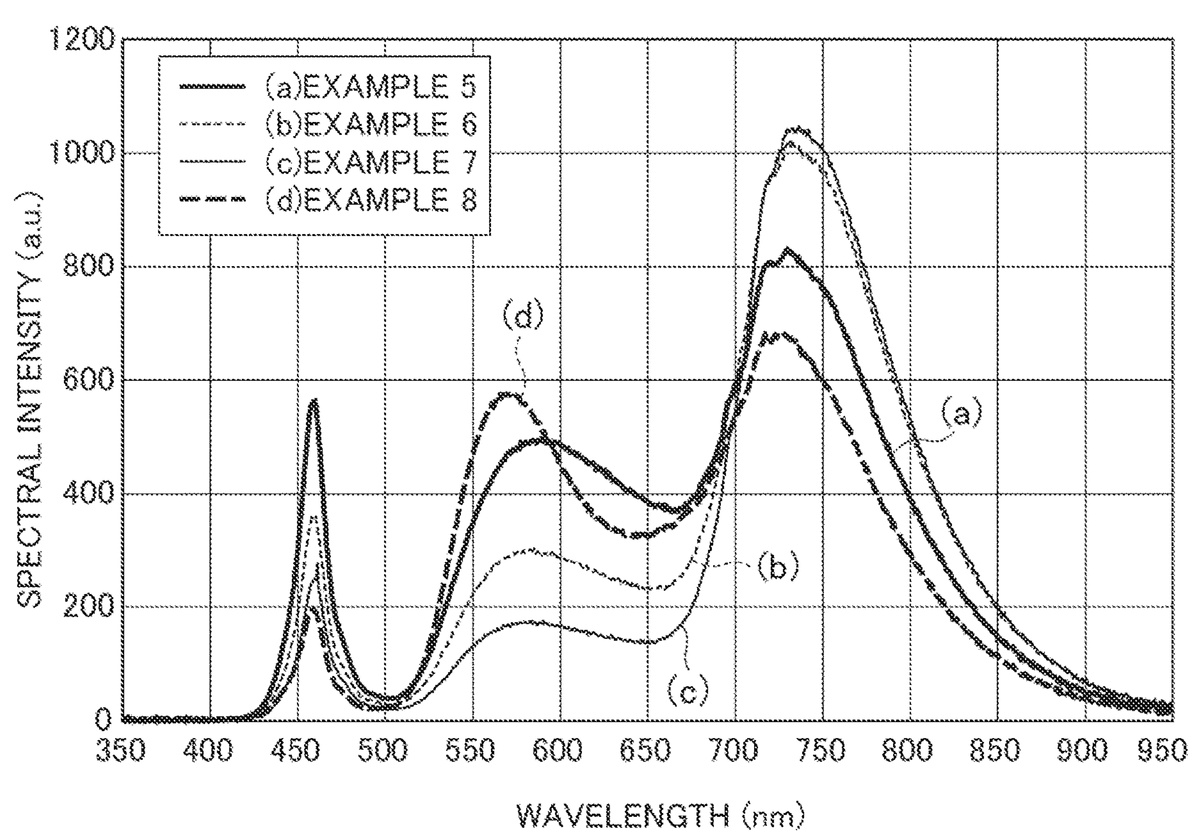
FIG. 9 is a graph illustrating the spectral distribution of output light emitted by light-emitting devices of Examples 5 to 8.

FIG. 9 collectively illustrates the spectral distributions of the output light of the light-emitting devices of Examples 5 to 8. As can be seen from FIG. 9, the spectral distributions of the output light of Examples 5 to 8 are similar to the spectral distributions in FIG. 8 and also have light components within the entire wavelength range of at least 420 nm or more and less than 950 nm. Furthermore, the output light is formed mainly of a light component (third light component) having a peak at around a wavelength of 460 nm, a fluorescent component (first light component) having a maximum intensity value at a wavelength of 560 to 600 nm, and a fluorescent component (second light component) having a maximum intensity value at a wavelength 720 to 750 nm. Here, the third light component is a light component derived from a blue LED. Furthermore, the first light component is a fluorescent component derived from an orange phosphor ($Ce^{3+}$ activated garnet phosphor, LuCaMG). The second light component is a fluorescent component derived from a near-infrared phosphor ($Cr^{3+}$ activated garnet phosphor, GLGG).

Also, in all spectral distributions, there is a first minimum value between the first light component and the second light component, and the maximum intensity value of the second light component is greater than the maximum intensity value of the first light component. In addition, the first minimum value was less than 50% of the maximum intensity value of the second light component, and specifically was 44.2% (Example 5), 22.5% (Example 6), 12.9% (Example 7), and 47.5% (Example 8). Furthermore, the maximum intensity value of the third light component 7 was small and was less than 70% of the maximum intensity value of the second light component 6, and specifically was 67.8% (Example 5), 35.6% (Example 6), 26.4% (Example 7), and 28.9% (Example 8).

From the above, these examples can also be said to be light-emitting devices that are advantageous for applications requiring output light that includes a green to yellow light component and an intense near-infrared light component.

Note that Table 5 collectively shows the characteristics of the output light of Examples 5 to 8. The output light of Examples 5 to 8 had a correlated color temperature of 1800 K or more and less than 3000 K, and a duv of −25 or more and less than 15. Furthermore, the average color rendering index (Ra) was a numerical value of 55 or more and less than 80. Note that the output light emitted by the light-emitting device in Example 8 was light of a color that was considered to be white light.

TABLE 5

| | Example 5 | Example 6 | Example 7 | Example 8 |
|---|---|---|---|---|
| Chromaticity coordinate x | 0.43 | 0.42 | 0.41 | 0.46 |
| Chromaticity coordinate y | 0.36 | 0.36 | 0.35 | 0.45 |
| Correlated color temperature (K) | 2748 | 2845 | 2757 | 2908 |
| duv | −18.0 | −18.1 | −22.1 | 12.4 |
| Ra | 73 | 74 | 78 | 56 |
| Driving current (mA) | 300 | 300 | 300 | 300 |

Here, in the light-emitting devices of Examples 5 to 7, it was evident that the color tone of the output light did not change greatly even when the thickness of the second wavelength converter 2A changed. From this data, Examples 5 to 8 can also be said to be light-emitting devices that are advantageous for obtaining output light that emits both high-output near-infrared rays and visible light.

Note that the spectral distribution of a wavelength-conversion light-emitting element varies depending on the LED used, the color tone (fluorescence peak wavelength) of the fluorescence emitted by a phosphor, the light absorption rate of a phosphor-containing wavelength converter (first wavelength converter 1A and second wavelength converter 2A), and so forth. Furthermore, the light absorption rate of a wavelength converter varies depending on the volume fraction of the phosphor in the wavelength converter, the thickness of the wavelength converter, and additionally the amount of activation of the fluorescent ions of the phosphor, the composition of the compound constituting the matrix, and the particle size. Also, other than the blue LEDs, white LEDs, and phosphors used in these examples, ones that emit light of a wide variety of color tones are commercially available. Therefore, the correlated color temperature, color rendering properties, and so forth of the output light are not limited to those in these examples.

The present embodiment has been described above, but the present embodiment is not limited to the above description, and various variations are possible within the scope of the gist of the present embodiment.

The entire contents of Japanese Patent Application No. 2021-026804 (filed on. Feb. 22, 2021) are incorporated herein.

INDUSTRIAL APPLICABILITY

According to the present disclosure, it is possible to provide a light-emitting device that is advantageous for increasing the output of visible light components and near-infrared light components of a specific wavelength, and to provide an electronic apparatus that uses the light-emitting device.

REFERENCE SIGNS LIST

4 Output light
5 First light component
6 Second light component
7 Third light component
8 First minimum value
9 Second minimum value
10, 10A, 10B, 10C, 10D Light-emitting device

The invention claimed is:

1. A light-emitting device comprising a solid-state light-emitting element, a first wavelength converter including a first phosphor, and a second wavelength converter including a second phosphor, and emitting output light, wherein the first wavelength converter comprises a wavelength converter in which the first phosphor is sealed with a silicone resin, an all-inorganic wavelength converter in which the first phosphor is sealed with a low-melting-point glass, an all-inorganic wavelength converter composed of the first phosphor with a binding material, or a sintered body obtained by sintering the first phosphor, wherein the second wavelength converter comprises a wavelength converter in which the second phosphor is sealed with a silicone resin, an all-inorganic wavelength converter in which the second phosphor is sealed with a low-melting-point glass, an all-inorganic wavelength converter composed of the second phosphor with a binding material, or a sintered body obtained by sintering the second phosphor, wherein a spectral distribution of the output light has a first light component derived from fluorescence emitted by the first phosphor, a second light component derived from fluorescence emitted by the second phosphor, and a third light component derived from light emitted by the solid-state light-emitting element, and has a first minimum value between the first light component and the second light component, and a second minimum value between the first light component and the third light component, the first light component is a fluorescent component having a maximum intensity value within a wavelength range of 560 nm or more and less than 700 nm, the second light component is a fluorescent component having a maximum intensity value within a wavelength range of 700 nm or more and less than 2500 nm, the maximum intensity value of the second light component is larger than the maximum intensity value of the first light component, and the first minimum value and the second minimum value are less than 50% of the maximum intensity value of the second light component.

2. The light-emitting device according to claim 1, wherein a spectral distribution of the second light component is unimodal when spectral intensities of each wavelength of 10 nm are displayed as a histogram.

3. The light-emitting device according to claim 1, wherein in the second light component, a wavelength difference between a wavelength on a long-wavelength side and a wavelength on a low-wavelength side at which an intensity that is 50% of the maximum intensity value is obtained is 50 nm or more and less than 200 nm.

4. The light-emitting device according to claim 1, wherein a spectral distribution of the first light component is unimodal when spectral intensities of each wavelength of 10 nm are displayed as a histogram.

5. The light-emitting device according to claim 1, wherein in the first light component, a wavelength difference between a wavelength on a long-wavelength side and a wavelength on a low-wavelength side at which an intensity that is 60% of the maximum intensity value is obtained is 50 nm or more and less than 200 nm.

6. The light-emitting device according to claim 1, wherein the third light component has a maximum intensity value within a wavelength range of 350 nm or more and less than 660 nm.

7. The light-emitting device according to claim 1, wherein the first light component has a maximum intensity value in a wavelength range of 570 nm or more and less than 650 nm.

8. The light-emitting device according to claim 1, wherein the first light component is derived from fluorescence emitted by the first phosphor activated with $Ce^{3+}$ or $Eu^{2+}$.

9. The light-emitting device according to claim 1, wherein the second light component is derived from fluorescence emitted by the second phosphor activated with $Cr^{3+}$.

10. The light-emitting device according to claim 1, wherein the first light component includes a fluorescent component having a maximum intensity value within a wavelength range of 570 nm or more and less than 650 nm, and the fluorescent component is derived from the first phosphor, which is activated with $Ce^{3+}$ and has a garnet-type crystal structure, and the second light component is derived from a fluorescent component of the second phosphor, which has an excitation peak within a wavelength range of 450 nm or more and less than 520 nm.

11. The light-emitting device according to claim 1, wherein the first light component includes a fluorescent component having a maximum intensity value within a wavelength range of 600 nm or more and less than 660 nm, and the fluorescent component is derived from the first phosphor, which is composed of a nitride or an oxynitride activated with $Eu^{2+}$, and the second light component is derived from a fluorescent component of the second phosphor, which has an excitation peak within a wavelength range of 600 nm or more and less than 750 nm.

12. The light-emitting device according to claim 1, wherein a maximum thickness of each of the first wavelength converter and the second wavelength converter is 100 μm or more and less than 5 mm.

* * * * *